United States Patent [19]
Doi et al.

[11] Patent Number: 5,223,733
[45] Date of Patent: Jun. 29, 1993

[54] SEMICONDUCTOR INTEGRATED CIRCUIT APPARATUS AND METHOD FOR DESIGNING THE SAME

[75] Inventors: Toshio Doi, Kokubunji; Takehisa Hayashi, Kodaira; Kenichi Ishibashi; Mitsuo Asai, both of Kokubunji, all of Japan

[73] Assignee: Hitachi, Ltd., Tokyo, Japan

[21] Appl. No.: 793,296

[22] Filed: Nov. 14, 1991

Related U.S. Application Data

[63] Continuation of Ser. No. 429,547, Oct. 31, 1989, abandoned.

[30] Foreign Application Priority Data

Oct. 31, 1988 [JP] Japan .................. 63-272970

[51] Int. Cl.⁵ ............... H01L 29/40; H01L 27/02; H01L 23/48
[52] U.S. Cl. ..................... 257/386; 257/390; 257/503; 257/508; 257/629; 257/659
[58] Field of Search ............... 357/45, 45 M, 53; 257/386, 390, 369, 401, 503, 508, 629, 659

[56] References Cited

U.S. PATENT DOCUMENTS

| | | | |
|---|---|---|---|
| 4,400,713 | 8/1983 | Bauge et al. | 357/45 |
| 4,774,559 | 9/1988 | Culican et al. | 357/45 |
| 4,829,358 | 5/1989 | Yamazaki | 357/45 |
| 4,857,987 | 8/1989 | Ogura et al. | 357/45 |
| 4,890,148 | 12/1989 | Ikeda et al. | 357/45 |

FOREIGN PATENT DOCUMENTS

| | | | |
|---|---|---|---|
| 60-140863 | 7/1985 | Japan | 357/45 |
| 60-170966 | 9/1985 | Japan | 357/45 |
| 61-78157 | 4/1986 | Japan | 357/45 |
| 62-60255 | 3/1987 | Japan | 357/45 |

Primary Examiner—Andrew J. James
Assistant Examiner—Ngan V. Ngo
Attorney, Agent, or Firm—Antonelli, Terry, Stout & Kraus

[57] ABSTRACT

A semiconductor integrated circuit device is provided which include a plurality of cell columns each having a number of unit cells previously fabricated on a semiconductor substrate selected from the plural kinds of unit cells which are formed in desired circuits by electrically connecting circuit devices previously arranged. Each column includes at least one kind of unit cell of a dynamic circuit which has a node in a floating state during the operation of the cell unit. A fixed potential shield layer is also provided on the cell columns so as to cover the nodes of the dynamic circuits. By virtue of this, a wiring area for electrically connecting the desired cell units can be located between the cell columns and above the shield layer. In other words, signal wirings in the wiring area can pass over the nodes of the dynamic circuits. without adverse parasitic effects. The unit cell can also be provided with a precharge circuit comprising a standard cell and an in-cell wiring layer. Further, clock input terminals of the unit cells which are provided with a precharge circuit can be divided into plural groups, with all of said clock input terminals belonging to the same group and having equal load capacitances being connected. Clock buffer cells can be provided for supplying clock signals to the clock signal wirings for each group.

27 Claims, 20 Drawing Sheets

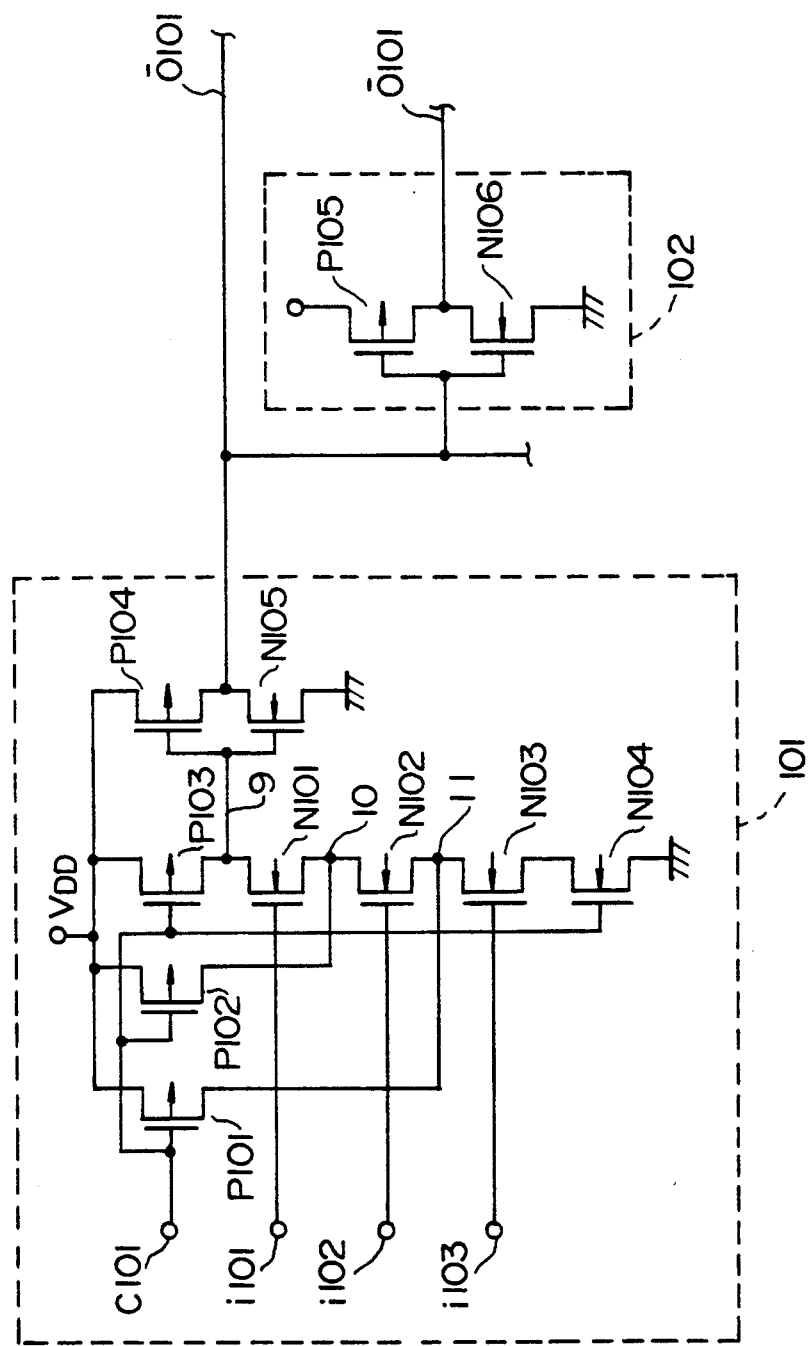
FIG. IA $$C_{LOAD} = C_\ell \cdot (L_x + L_y) + n \cdot C_{in}$$

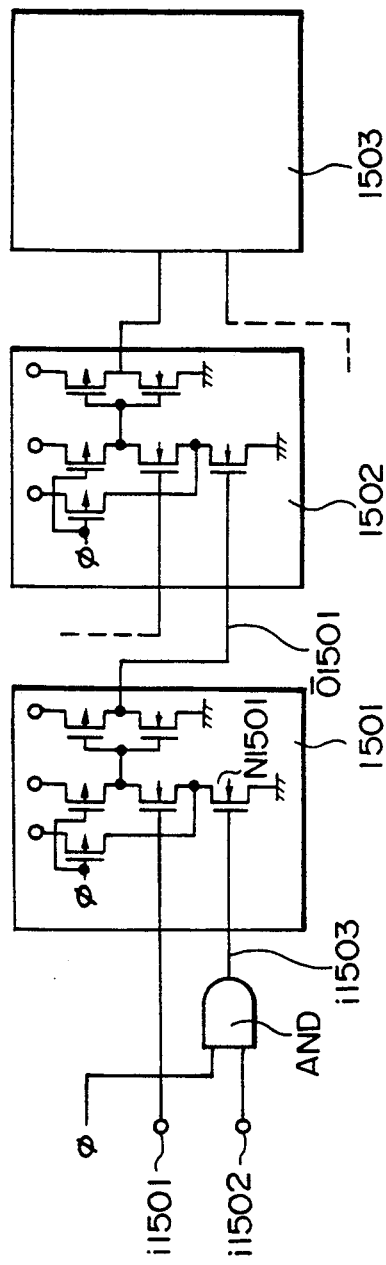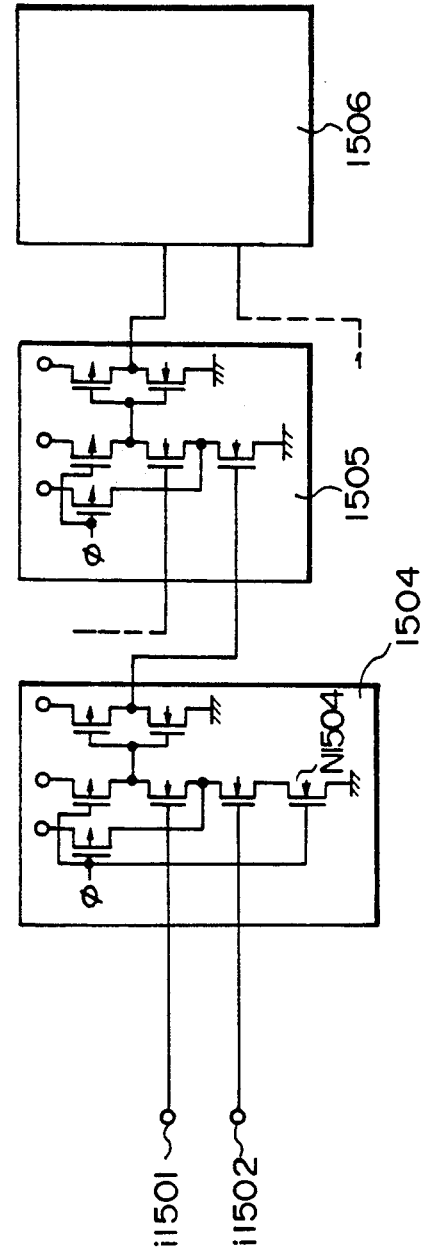

FIG. 19
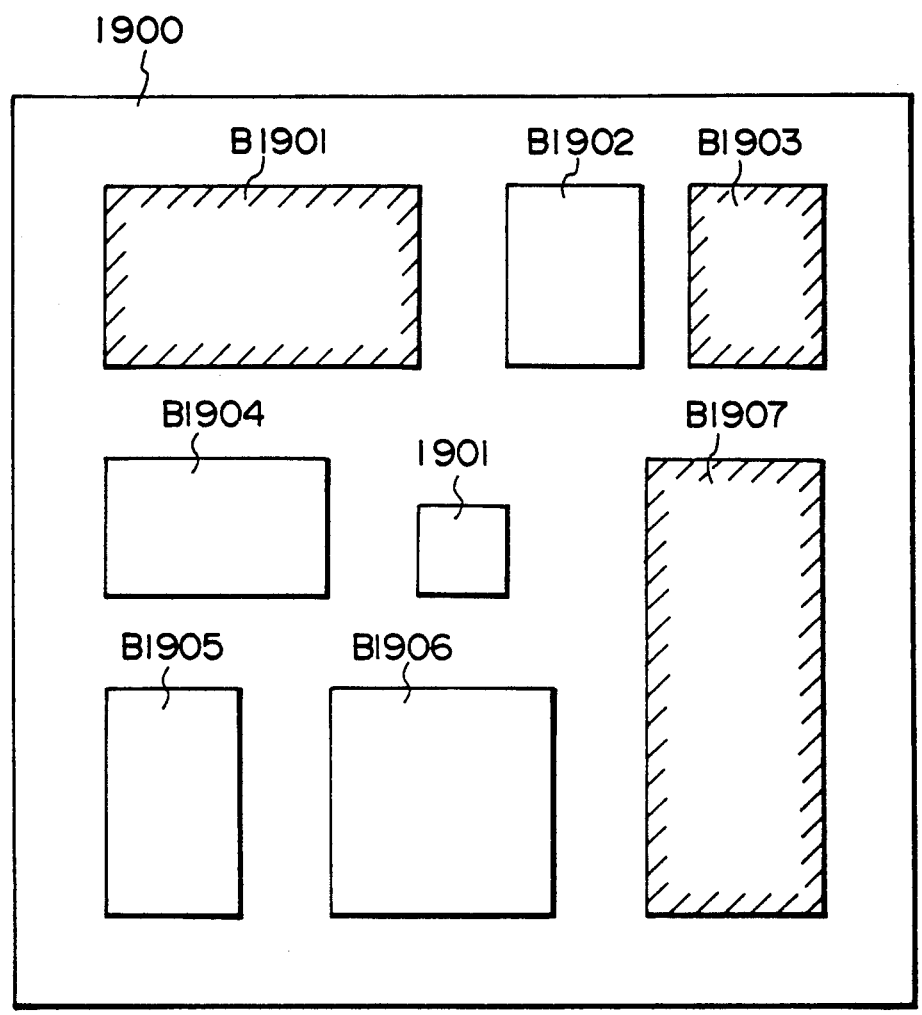
 BLOCK WITH PRECHARGE CIRCUIT
 BLOCK WITH NO PRECHARGE CIRCUIT FIG. 20 A
FIG. 20 C
FIG. 20 B
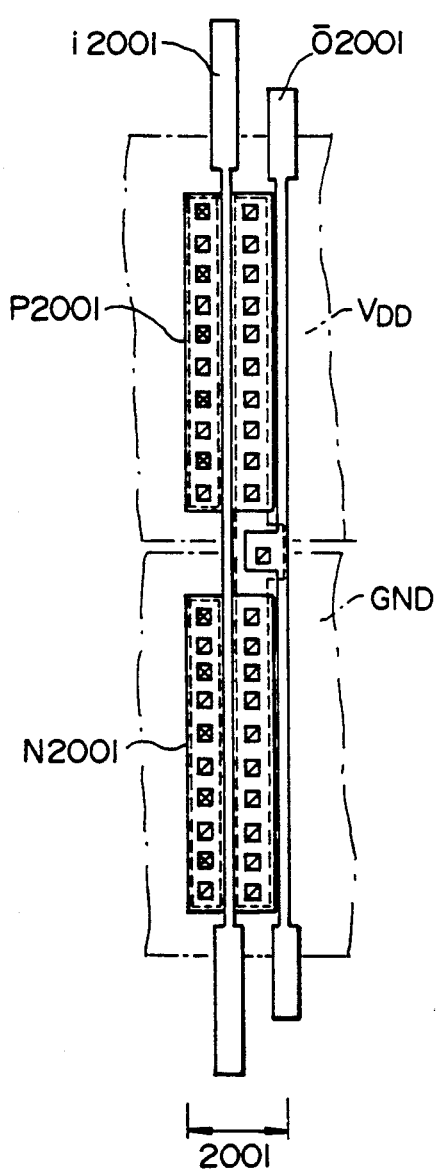
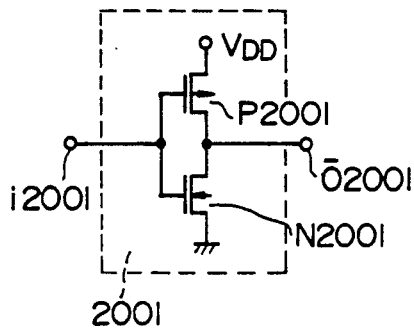
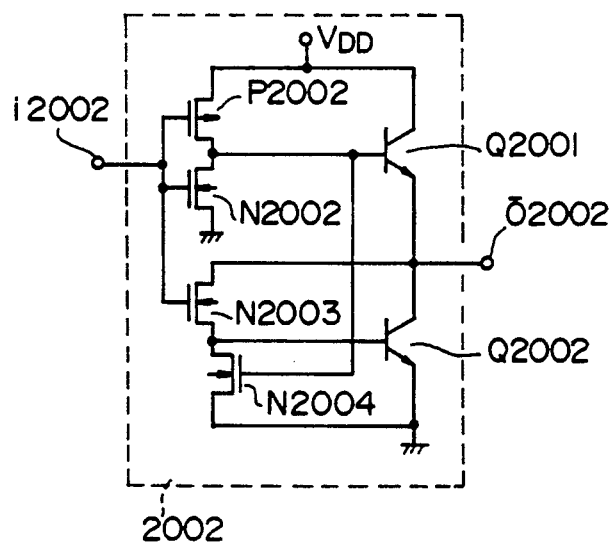

SEMICONDUCTOR INTEGRATED CIRCUIT APPARATUS AND METHOD FOR DESIGNING THE SAME

This application is a continuation of application Ser. No. 429,547, field on Oct. 31, 1989 now abandoned.

BACKGROUND OF THE INVENTION

The present invention relates to a semiconductor integrated circuit device. More particularly, the present invention relates to a semiconductor integrated circuit device in a standard cell system which can be designed to provide a high speed large scale integrated circuit (LSI) with dynamic circuits within a short period. A method for designing it is also disclosed.

A high speed logic LSI with dynamic precharged circuits has been discussed in ISSCC Digest of Technical Papers, 1987, p. 62. Also, the speed-up technique using precharged circuits has been discussed in Symposium on VLSI Technology, Digest of Technical Papers, pp. 93, 1987, and JPA-62-98827. Moreover, shortening of a designing period by means of a design automation system has been disclosed in Proceedings of ICCC, 1982, pp. 512-515.

The high speed operation of a circuit with complicated logic capability using a precharged circuit according to the above prior art can be realized. In designing such as LSI using this circuit, however, it was necessary to pay attention to the following items, and, it correspondingly, was difficult to apply such a standard cell system to it.

(1) If there is capacitive coupling between dynamic nodes within circuit and signal operations adjacent thereto influence the dynamic nodes, the potentials of the dynamic nodes being changed due to potential changes in the wirings in circuit operation. This may reduce the operation margin of the circuit and further cause the malfunction thereof. In making the layout of cells, therefore, it is necessary to pay attention to the electro-static capacitance between wiring within such a cell and its dynamic node.

(2) For the same reason as above, it is impossible to pass the signal wirings above the cells with such precharged circuits.

(3) It is necessary to supply all the cells using the precharged circuits with clock signals with the same phase.

As regards the above item (1), in designing the layout of various kinds of unit cells required to design LSI, the work therefor must be advanced while paying attention to the item (1) for each cell. This makes it difficult to automate the work and thus it takes a very long time to design LSI. Also, if the rule of the layout, the process, etc. are varied, the amount of work required to modify the layout of the unit cells will be enormous. Further, in the step of arranging a great number of unit cells thus formed and making wirings therefor to complete LSI, the above fact of (2) is a great obstacle to the automatic wiring using the DA (design automation) technique. Moreover, for the item (3), it is necessary to carefully design the system of supplying clock signals for the entire LSI chip. This is also an obstacle to the design automation.

Furthermore, JPA-63-160241 discloses a semiconductor integrated circuit in a standard system in which a wiring inhibiting area is located at least on the output node of a dynamic cell in a dynamic operation. The technique, however, is disadvantageous in the integration or packaging density, and also the above wiring inhibiting area is an obstacle to the automatic wiring using the design automation technique.

SUMMARY OF THE INVENTION

An object of the present invention is to provide a standard cell type semiconductor integrated circuit device which enables designing a high speed LSI in a short time by applying the DA technique to the LSI including a dynamic circuit which has a node in a floating state in operation, e.g. a precharged circuit.

Another object of the present invention is to provide a method for designing a plurality of LSI's with the same logic function but different performances, costs, etc. on the basis of a set of data in accordance with performances and costs required for the LSIs.

Still another object of the present invention is to provide a method for reducing the number of steps of designing unit cells which are basic units in LSI designing, and constructing a cell library which can swiftly follow the change of a layout rule.

Yet another object of the present invention is to provide a method for reducing the number of stages of a logic circuit including a section consisting of a plurality of precharged circuits in a cascade connection.

The present invention relates to a semiconductor integrated circuit device in a standard cell system. The semiconductor circuit device in a standard cell system is constructed as follows. A great number of desired unit cells are previously fabricated on a semiconductor substrate; the desired unit cells are selected from plural kinds of unit cells which are formed in desired circuits by electrically connecting circuit devices (elements) previously arranged. Several kinds of logic circuits having different functions can be fabricated in a short period by only connecting the desired cell units as required.

In the present invention, a plurality of unit cells include at least one kind of unit cell of a dynamic circuit (hereinafter referred to as a dynamic cell) which has a node in a floating state during the operation of the unit cell. As mentioned above, if there is capacitive coupling between the node of the dynamic circuit, which is at a high impedance, and its neighboring signal wiring, the node will be influenced by the change in the potential of the signal wiring. In the prior art, therefore, it was required to locate a signal wiring inhibit area above the unit cell of the dynamic circuit. In accordance with the present invention, at least one shield layer with its potential fixed, e.g. a power supply wiring layer for supplying the power to the unit cells, is provided so as to cover the dynamic node of the dynamic circuit, and also at least one signal wiring layer for electrically connecting unit cells is provided on the shield layer.

More specifically, in accordance with the present invention, there is provided a semiconductor integrated circuit device in a standard cell system, which comprises a great number of desired unit cells previously fabricated on a semiconductor substrate selected from plural kinds of unit cells which are formed in desired circuits by electrically connecting circuit elements previously arranged. At least one kind of unit cell of a dynamic circuit is included which has a node in a floating state during the operation of the cell unit. At least one wiring layer for connecting said circuit elements in each of the unit cells is arranged on the substrate and at least one shield layer with its potential fixed is provided so as to cover the node of the dynamic circuit. Also at least one wiring layer for electrically connecting the unit cells is provided on the shield layer. As shown in FIGS. 1B and 9, the desired unit cells are one-dimensionally arranged to constitute cell rows (although the invention could also be practiced by laying the cells out in columns) which are arranged in parallel; wiring areas for connecting the unit cells are located between the cell columns. Specifically, the wiring areas for connecting are provided between the cell rows and on the shield layer. Clock signal wirings in parallel with the cell rows are provided on the wiring areas between the cell rows and connected with the clock input terminals of the dynamic cells. The clock input terminals of the dynamic cells are classified into plural groups. The above clock signal wirings are arranged so that they are connected with all the clock input terminals and provide equal load capacitances. A clock buffer cell for supplying clock signals to the clock signal wirings is provided for each group of the clock input terminals. The clock buffer cell is provided within the cell row.

In accordance with the present invention, the signal wiring area is provided also on a dynamic cell so that the location of the signal wiring area is not limited and the location of the clock buffer cells is also not limited. Therefore, it is possible to design an LSI with dynamic cells in a standard cell system by means of automatic wiring using the DA technique.

Further, in accordance with the present invention, in order to design LSI's with different characteristics on the basis of a set of design data, a cell library is provided comprising plural kinds of unit cells, which are the same in their function but different in their process or circuit construction. The plurality of kinds of unit cells include cells each including a bipolar transistor and other cells each having the same function as the former cells but not having a bipolar transistor. Therefore, by selecting optimum unit cells from the cell library comprising plural kinds of unit cells, it is possible to design LSI in accordance with the required performance, cost, etc.

Furthermore, in accordance with the present invention, in order to reduce the number of the steps or design time required to design each unit cell, a cell library is constructed by a combination of several kinds of basic cells and information for in-cell (internal cell) wiring for each cell. The plural kinds of unit cells include at least one kind of unit cell formed by combining a basic cell (first sub-cell) having circuit devices (elements) arranged in accordance with a prescribed layout and a in-cell (internal cell) wiring layer (second sub-cell) for electrically connecting the desired circuit devices in the basic cell to constitute a desired circuit. In particular, it should be noted that the dynamic cell of a dynamic circuit is composed of the basic cell and the in-cell wiring layer. The basic cell (first sub-cell) includes two or more kinds of MOS FET areas having the same conduction type and different gate widths. On the other hand, the in-cell wiring layer (second sub-cell) has a virtual lattice on the points of which contact-holes for electrical connection to desired circuit elements and through-holes for electrical connection to a power supply wiring layer are arranged and wirings for electrically connecting the desired circuit devices are provided. Thus, the layout of cell units can be symbolically performed on the basis of the basic cell and information for wiring. This enables the required for constructing the cell library to be greatly shortened.

BRIEF DESCRIPTION OF THE DRAWINGS

FIGS. 1A to 1D are a circuit diagram of the main part of one embodiment of a semiconductor integrated circuit apparatus according to the present invention, a view of cell layout thereof, and circuit diagrams of examples of a unit cell used in the present invention, respectively;

FIGS. 15A and 15B are views showing examples of the signal pulse in the case where precharged circuits are connected in series in plural stages according to one embodiment of the present invention;

FIG. 19 is a schematic diagram of the layout of an LSI chip according to one embodiment of the present invention; and FIGS. 20A to 20C are circuit diagrams of examples of a clock buffer cell which is one of the unit cells used in the present invention, and a schematic diagram of the layout thereof, respectively.

DESCRIPTION OF THE PREFERRED EMBODIMENTS

Figure 1B:
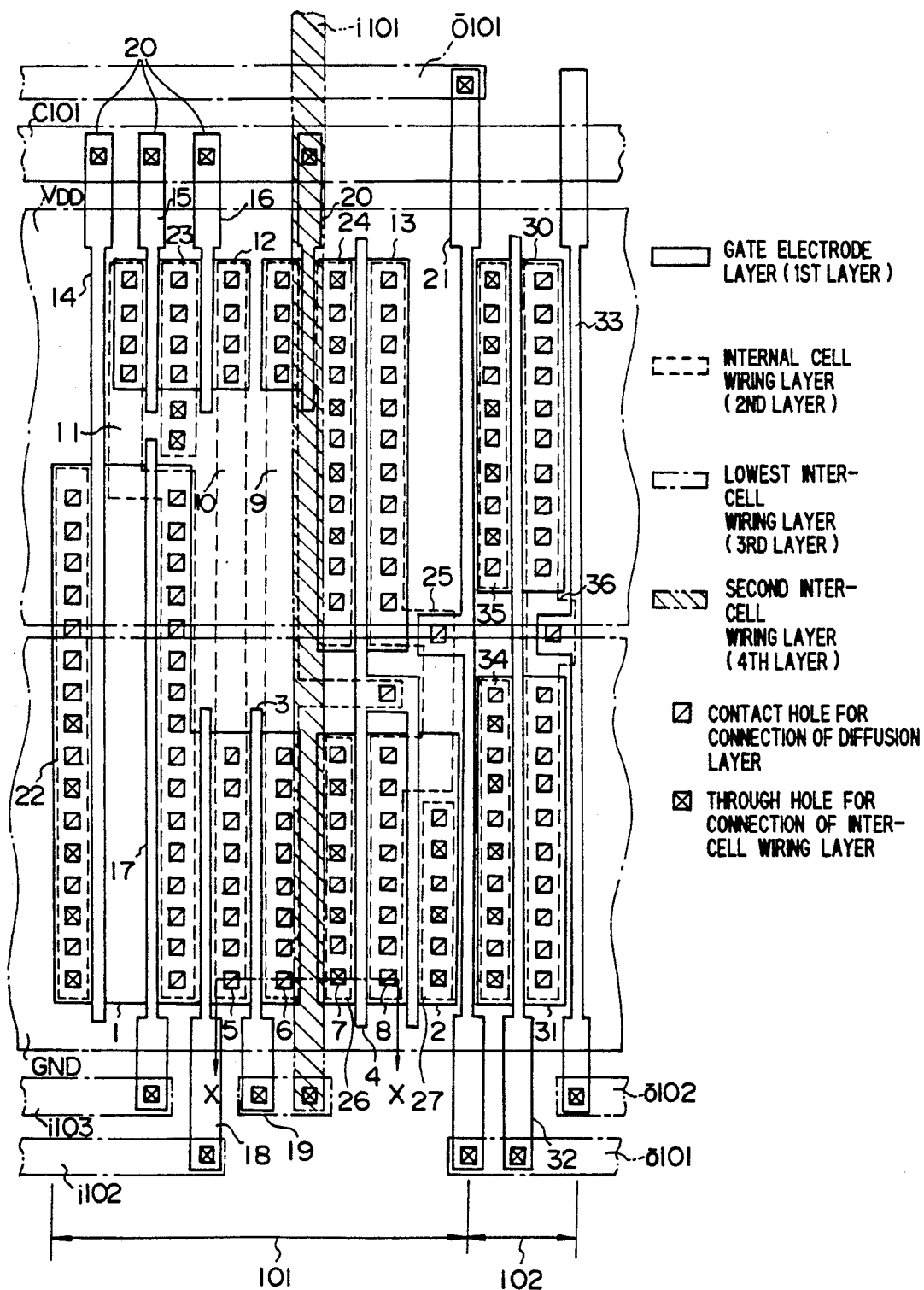
Figure 1C:
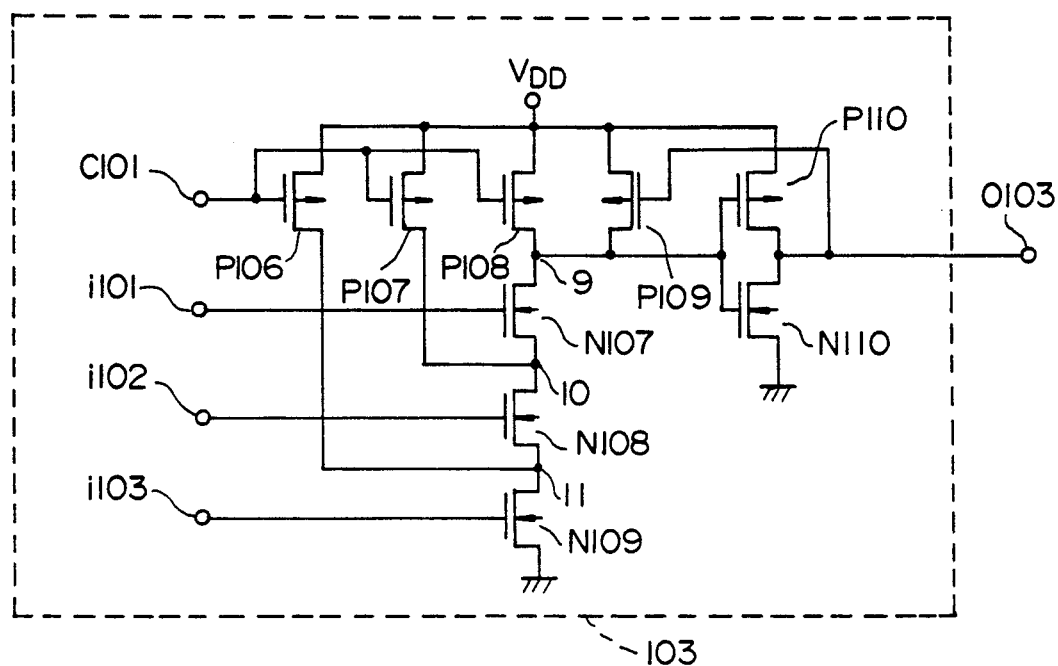
Figure 1D:
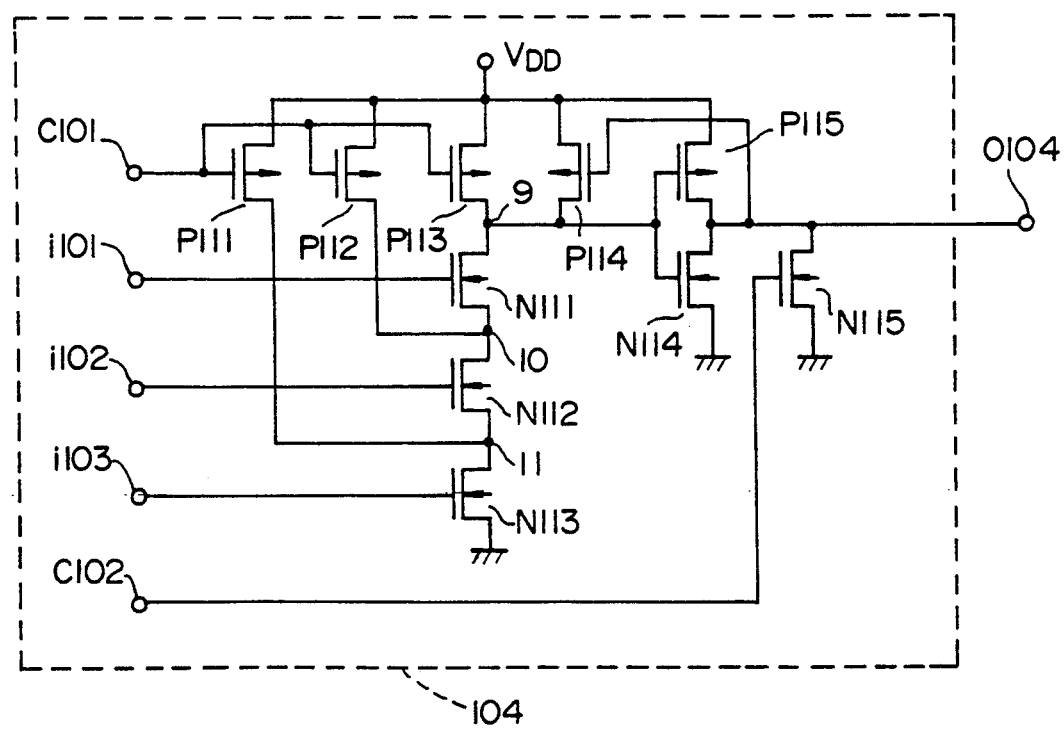

FIGS. 1A to 1C show the main part of the semiconductor integrated circuit according to the present invention; more specifically, FIG. 1A is a circuit diagram of the cell unit used therein, FIG. 1B is a schematic diagram of the layout of the cell, and FIGS. 1C and 1D are circuit diagrams of the unit cells in other circuit forms. In these FIGS., 101, 103 and 104 are three-input AND cells formed of charged circuits; 102 is an inverter cell formed of a CMOS static circuit; C101 and C102 are clock signal wirings; i101 to ii103 are input signal wirings; $V_{DD}$ is a power supply wiring; GND is a ground wiring; 0101 is an output signal of the AND cell; 0102 is an output signal wiring of the inverter cell 102;

0103 is an output signal wiring of the AND cell 103; 0104 is an output signal wiring of the AND cell; P101 to P115 are PMOS FET's; and N101 to N115 are NMOS FET's. Now referring to FIG. 1A, the operation of the circuit of the unit cell will be explained briefly. This circuit is a dynamic logic circuit for executing the logic operation of (A B C) On the basis of input signals of A, B and C from the input signal wirings i101, i102 and i103. The dynamic logic circuit consists of a precharging operation which is used for preparation before the operation and the subsequent operation (arithmetic). First, the precharging operation is carried out as follows. A clock signal on the clock signal wiring c101 is set to be at a ground potential (referred to as a low level or 'low'). Thus, PMOSFET's P101, P102 and P103 become 'on' whereas NMOSFET 104 becomes 'off'. A node (dynamic node) 9 is charged to a power supply potential (referred to as a high level or 'high') by the precharged PMOSFET P103. Internal nodes 10 and 11 become 'high' by the precharged PMOSFET's P102 and P103. PMOSFET P104 becomes 'off' whereas NMOSFET N105 becomes 'on'. Thus the output from the output signal 0101 becomes 'low'.

The arithmetic operation will be explained. When the clock signal on the clock signal wiring G101 is set to be 'high', PMOSFET's P101 to P103 becomes 'off' whereas NMOSFET N104 becomes 'on'. Then, if the path between the node 9 and ground becomes conductive owing to the data supplied to the input signal wirings i101 and i103, the charges charged at the node 9 through the precharging operation will be discharged to ground. As a result, the potential at the node 9 lowers; thus PMOSFET P104 becomes 'on' whereas NMOSFET N105 becomes 'off'. Consequently, the parasitic capacitance of the output signal wiring 0101 is charged through PMOSFET P104 so that the output of the output signal wiring 0101 is boosted to the high level. Thus, the arithmetic operation is completed.

The dynamic logic circuit using the precharged circuit as mentioned above can perform any arithmetic operation by modifying the construction of the logic part consisting of PMOSFET's P101 to P103 and NMOSFET's N101 to N104.

The unit cells formed of the dynamic logic circuits as shown in FIGS. 1C and 1D also operate in the same manner as the three-input AND cell of FIG. 1A. The unit cells of FIGS. 1C and FIG. 1D will be explained as to their construction and operation.

In the unit cell of FIG. 1C, a feedback PMOSFET P109 is added to the circuit of FIG. 1A. More specifically, the feedback PMOSFET P109 has a drain connected with the output node 9 of the logic part consisting of the precharged PMOSFET's P106 to )108 and NMOSFET's N106 to N108, a gate connected with an output signal wiring 0103, and a source connected with a power supply wiring $V_{DD}$. In operation, the feedback PMOSFET P109 is 'on' during the precharging operation as mentioned in connection with FIG. 1A. When the clock signal on the clock signal wiring C101 is made 'high', the arithmetic operation starts. When the path between the output node 9 of the logic part and ground becomes conductive owing to input signals from the input signal wirings i101 to i103, the potential at the node 9 lowers. Thereafter, PMOSFET P110 becomes 'on' whereas NMOSFET N110 becomes 'off'; the potential at an output node 0103, therefore, is boosted to the high level. Also, the feedback PMOSFET P109 becomes 'off'.

The effect of latching the potential at the logic part output node 9 by feedback PMOS P109 with the internal nodes 10 and 11 in the logic part being precharged resides in the reduction of noise voltage in a CMOS inverter stage consisting of P110 and N110. Namely, if α ray passes through the drain of NMOSFET 107 in the state where the node 9 is charged upto a high level by a precharge operation to start a logic operation and the path between the node 9 and ground is made non-conductive by input signals of i101 to i103, α-ray generated noise electrons will be collected at the drain the potential at the node 9, therefore, will be lowered. The waveform thus formed is a spike-like waveform with a very short pulse width (a compared with that occurring in the normal circuit operation) so that before the above CMOS inverter responds to it, the noise current from the node 9 to the substrate due to the α ray ceases. The potential at the node once lowered is restored by charging through PMOSFET P109 which is in a conducting state during the above period. Thus, the noise voltage at the CMOS inverter can be reduced.

The unit cell shown in FIG. 1D is a three-input AND cell using merits of both a CMOS static inverter and a CMOS dynamic inverter. The unit cell is composed of an output buffer part formed of an inverter, a logic part and a feedback part. The output buffer part is composed of PMOSFET P115 with its drain connected with an output node 0104, its gate connected with the output node 9 from the logic part and its source connected with a power supply wiring $V_{DD}$; NMOSFET N114 with its drain connected with the output node 0104, its gate connected with the node 9 and its source connected with ground; and NMOSFET N115 with its drain connected with the output node 0104, its gate connected with a clock signal wiring C102 and its source connected with ground. The logic part is composed of a logic circuit network consisting of NMOSFET's N111 to N113, and PMOSFET's P113 to P111 for precharging the internal nodes 9 to 11 in the logic circuit network. The feedback part is formed of MOSFET P114 with its drain connected with the node 9, its gate connected with the output node 0104 and its source connected with the power supply wiring $V_{DD}$. In operation, charge extraction at the output node 0104 in the precharging operation is mainly carried out through NMOSFET N115. The input of clock signals and the circuit operation during the precharging operation and arithmetic operation are the same as in the circuits shown in FIGS. 1A and 1B.

Incidentally, the dynamic logic circuits as shown in FIGS. 1C and 1D in which the internal nodes of a logic circuit network are precharged and the output node of a logic part is latched by a feedback PMOSFET is disclosed in U.S. Pat. application Ser. No. 397199 which was filed on Aug. 23, 1989 by the same inventors as this application.

The layout of the unit cell used in the present invention will be explained. FIG. 1B is a plan view showing the circuit pattern consisting of the three-input AND cell 101 and the inverter cell 102. In FIG. 1B, 1 (L-shaped and enclosed by a bold solid line) is an NMOS area where NMOSFET's N101 to N104 are formed in the three-input AND cell 101; 2 (square shaped and enclosed by a bold solid line) is an NMOS area constituting an NMOSFET N105; 3 (indicated by a thin solid line) is a gate electrode of NMOSFET N101 connected with the input signal wiring i101; 4 (indicated by a thin solid line) is a gate electrode of NMOSFET N105 and PMOSFET P104; 5, 6, and 8 are contact holes for connecting a diffused layer; 7 is a through-hole for connecting inter-cell wirings; 9 (indicated by a dotted line) is an in-cell wiring of connecting the drain region of PMOSFET P103, the drain region of NMOSFET N101 and the gate electrode 4 to constitute an output node of the logic part; 10 (indicated by a dotted line) is an in-cell wiring of connecting the drain region of PMOSFET P102 and the source and drain regions of NMOSFET's N101 and N102 to constitute an internal node of the logic part; 11 (indicated by a dotted line) is an in-cell wiring of connecting the drain region of PMOSFET P101 and the source and drain regions of NMOSFET's N102 and N103 to constitute an internal node; 12 (indicated by a bold solid line) is a PMOSFET area to constitute PMOSFET's P101 and P102; 13 is a PMOSFET's area to constitute PMOSFET's P103 and P104; 14 (indicated by a thin solid line) is a gate electrode of NMOSFET N104 having a terminal 20 connected with the clock signal wiring C101; 15 (indicated by a thin solid line) is a gate electrode of PMOSFET P101 having the terminal connected with the clock signal wiring C101; 16 (indicated by a thin solid line) is a gate electrode of PMOSFET P102 having the terminal 20 connected with the clock signal wiring C101; 17 (indicated by a thin solid line) is a gate electrode of NMOSFET N103 having a terminal connected with the input signal wiring i103; 18 (indicated by a thin solid line) is a gate electrode of NMOSFET N102 having a terminal connected with the input signal wiring; 19 (indicated by a one-dot chain line) is an in-cell wiring of connecting the input signal wiring i101 (hatched) arranged on the power supply wiring $V_{DD}$ and the ground GND with the gate electrode 3; 20 (indicated by a thin solid line) is a gate electrode of PMOSFET P103 having a terminal connected with the clock signal wiring C101; 21 (indicated by a thin solid line) is a wiring of connecting an in-cell wiring 25 (indicated by a dotted line), which connects the drain region of PMOSFET with the drain of NMOSFET N105, with the output signal wiring 0101 to constitute an output node of the cell unit 101; 22 (indicated by a dotted line) is an in-cell wiring of connecting the source region of NMOSFET N104 with the ground wiring GND; 23 (indicated by a dotted line) is an in-cell wiring of connecting the source regions of PMOSFET's P101 and P102 with the power supply wiring $V_{DD}$; 24 (indicated by a dotted line) is an in-cell wiring of the source regions of PMOSFET's P103 and P104 with the power supply wiring $V_{DD}$; and 26 and 27 (indicated by dotted lines) are in-cell wirings of connecting the source region of NMOSFET N105 with the ground wiring GND.

30 (indicated by a bold solid line) is a PMOS area constituting PMOSFET P105 in the inverter cell 102; 31 (indicated by a solid line) is an NMOS area constituting NMOSFET N106 in the inverter cell 102; 32 (indicated by a thin solid line) is a gate of PMOSFET P105 and NMOSFET N106 and it has the terminal connected with the output signal wiring 0101; 33 (indicated by a thin solid line) is a wiring of connecting an in-cell wiring 36 (indicated by a dotted line), which connects the drain region of PMOSFET P105 with the drain region of NMOSFET N106, with the output signal 0102 to constitute an output node of the inverter cell 102; 34 (indicated by a dotted line) is an in-cell wiring of connecting the source region of NMOSFET N106 with the ground wiring GND; 35 (dotted line) is an in-cell wiring of connecting the source region of PMOSFET P105 with the power supply wiring $V_{DD}$.

Figure 2:
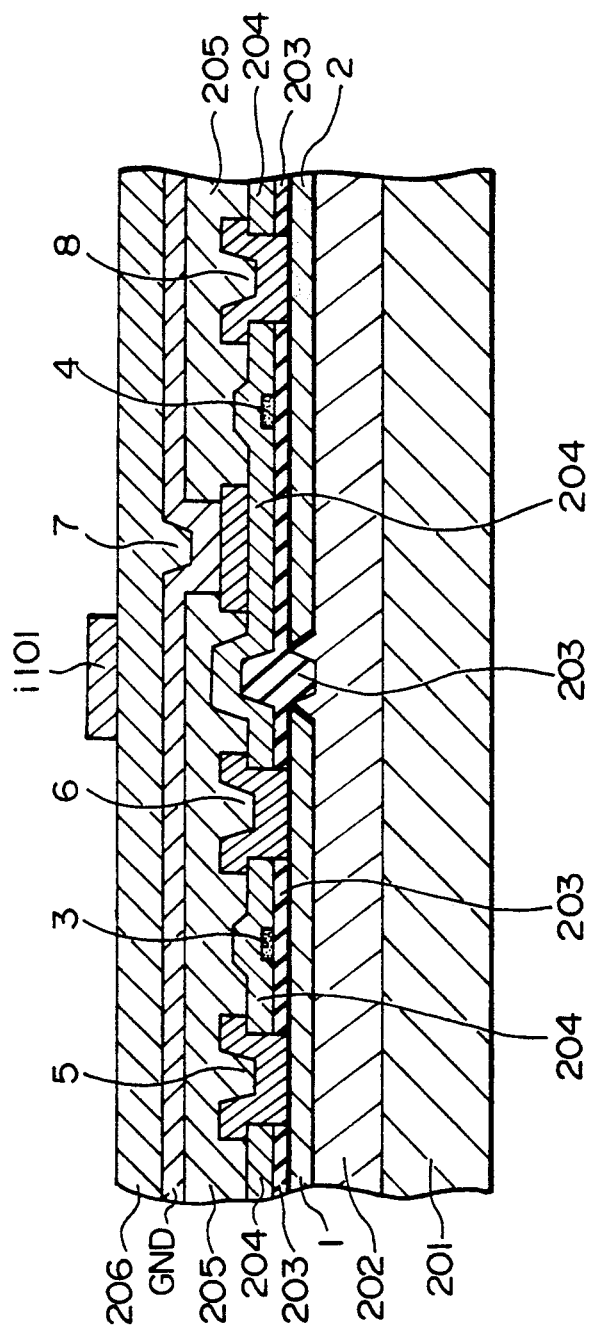
FIG. 2 is a sectional view taken along line X-X in FIG. 1B.

FIG. 2 is a sectional view taken along line X—X in FIG. 1B. In FIG. 2, 201 is an Si substrate; 202 is a well; 203 is an oxide film; and 204, 205 and 206 are interlayer insulating films. Incidentally, in this figure, the inter-cell wiring layer, inter-layer insulating film and passivation film, which are provided over the input wiring layer i101, are not shown for convenience of illustration. The following items should be noted in this embodiment.

A. As seen from FIG. 1B, the dynamic cell 101 using a precharged circuit is set in the same manner as the standard cell 102 formed of a CMOS static circuit in their layout specification such as the arrangement of power supply $V_{DD}$ and ground wiring GND, the shape and height of the cell, the position of input/output terminals, etc. Therefore, the layout of the dynamic cells can also be completed by means of the same DA (design automation) technique as for the standard cell system.

B. The dynamic nodes 9 to 11 in the dynamic cell 101 are covered, on their upper side, with the power supply wiring $V_{DD}$ and the ground wiring GND the potential of which is fixed; the static capacitance between the signal wiring i101 passing above the cell and the dynamic nodes, therefore, can be restricted to a sufficiently small value. Thus, the wiring above the cell can be made with great freedom. Therefore, the inter-cell wiring can be automated as in the standard cell.

C. Since the clock signal wiring C101 is arranged adjacently to the upper end of a cell row along the cell row, the cell requiring a clock signal can be automatically connected with the clock signal wiring C101 by providing the terminal 20 for supplying a clock signal. Also, in automatically making the wirings by means of the DA technique, it is not necessary to make the clock signal wirings.

Owing to the above facts, in accordance with the present invention, an LSI including the dynamic cells using precharged circuits can be automatically designed by means of the same DA technique as for the standard cell system. Moreover, it is possible to prevent the clock signal wiring C101 from being an obstacle to the other signal wirings (inter-cell wirings) by providing the clock signal wiring C101 in the channel closest to the cell row. Furthermore, the clock signal wiring C101, since the number of MOSFET's connected to C101 is larger than that of the other signal wirings, provides a large load capacitance; the current flowing through the clock signal wiring C101 in operation, therefore, is also large. For this reason, the clock signal wiring C101 suffers from a more strict condition for the potential drop due to wiring resistance, increase of delay time and electro-migration than the other signal wirings. This can be relaxed by making the width of the clock signal wiring C101 larger than that of the other signal wirings i101 to i103 and 0101 and 0102 as shown in FIG. 1B.

Figure 3A:
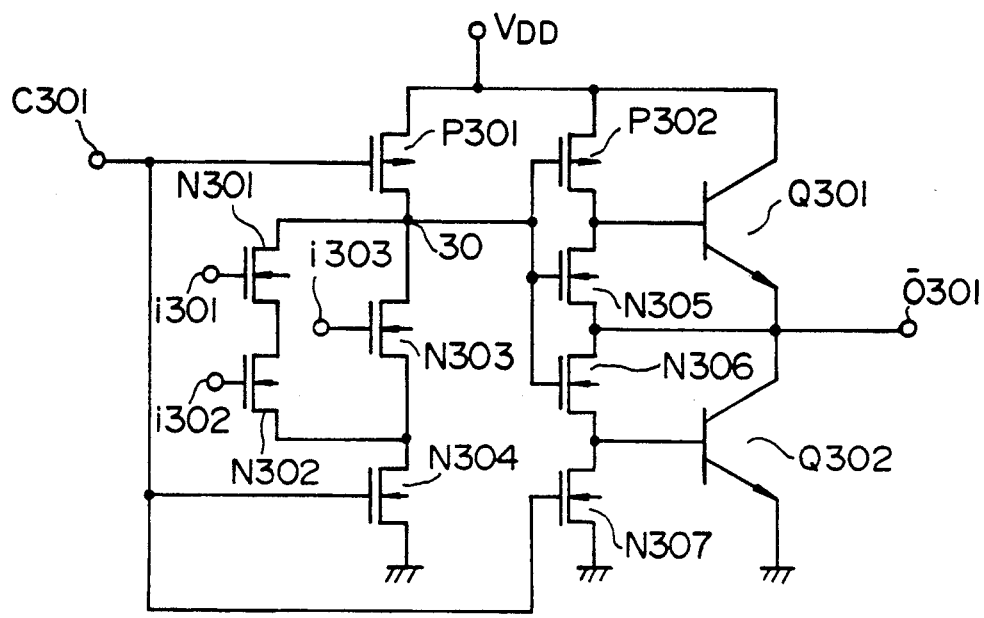
FIGS. 3A and 3B, and FIGS. 4A and 4B are circuit diagrams of other embodiments of the unit cell used in the present invention, respectively.
Figure 3B:
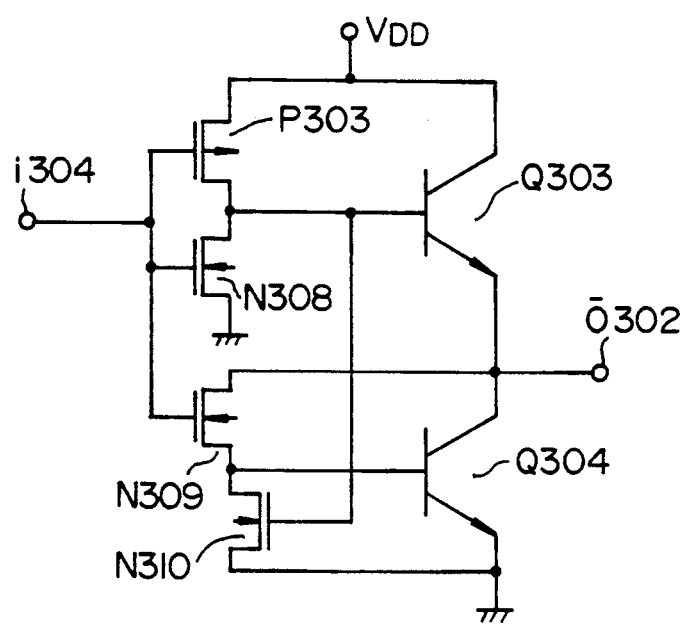

Although in the above embodiment, the CMOS circuits were used, Bi-CMOS circuits in which bipolar transistors ar also used may be used for realizing a higher speed LSI as described below. FIGS. 3A and 3B show another example of the unit cell used in the present invention. Specifically, FIG. 3A is a circuit diagram of the unit cell using a Bi-CMOS circuit, and FIG. 3B is a circuit diagram of a Bi-CMOS inverter cell. In FIGS. 3A and 3B, C301 is a clock signal wiring; i301 to i304 are input signal wirings; 0301 and 0302 are output signal wirings; P301 to P303 are PMOSFET's N301 to N310 are NMOSFET's; and Q301 to Q304 are NPN bipolar transistors.

In the precharge circuit of FIG. 3A, a predetermined logical operation for signals supplied to the input signal wirings i301 to i303 is carried out by the logic part consisting of PMOSFET P301 and NMOSFET's N301 to N304. The result thereof is sent through a node 30 to the output buffer part consisting of PMOSFET P302, NMOSFET's N305 to N307, and NPN bipolar transistors Q301 and Q302. The output from the output buffer part is extracted from an output signal terminal. Such a BiMOS precharge circuit is disclosed in FIG. 6 of U.S. Pat. Application Ser. No. 246,196 filed Sep. 19, 1989 by some of the inventors of the present invention, and so its operation is not explained.

The BiCMOS inverter cell shown in FIG. 3B consists of a PMOSFET P303, NMOSFET's N308 to N310, and an NPN bipolar transistor. More specifically, PMOSFET P303 has a drain connected with the base of the bipolar transistor Q303, a gate connected with an input signal wiring 1304, and a source connected with a power supply wiring $V_{DD}$; NMOSFET N308 has a drain connected with the base of the bipolar transistor Q303, a gate connected with the input signal wiring i304, and a source connected with ground; the NPN bipolar transistor Q303 has a collector connected with the power supply wiring $V_{DD}$ and an emitter connected with an output node 0302; NMOSFET N309 has a drain connected with the output node 0302, a source connected with the base of the bipolar transistor Q304, and a gate connected with ground; NMOSFET N110 has a gate connected with the base of the bipolar transistor Q303 and a source connected with ground; and the bipolar transistor Q304 has a collector connected with the output node and an emitter connected with ground.

Figure 4A:
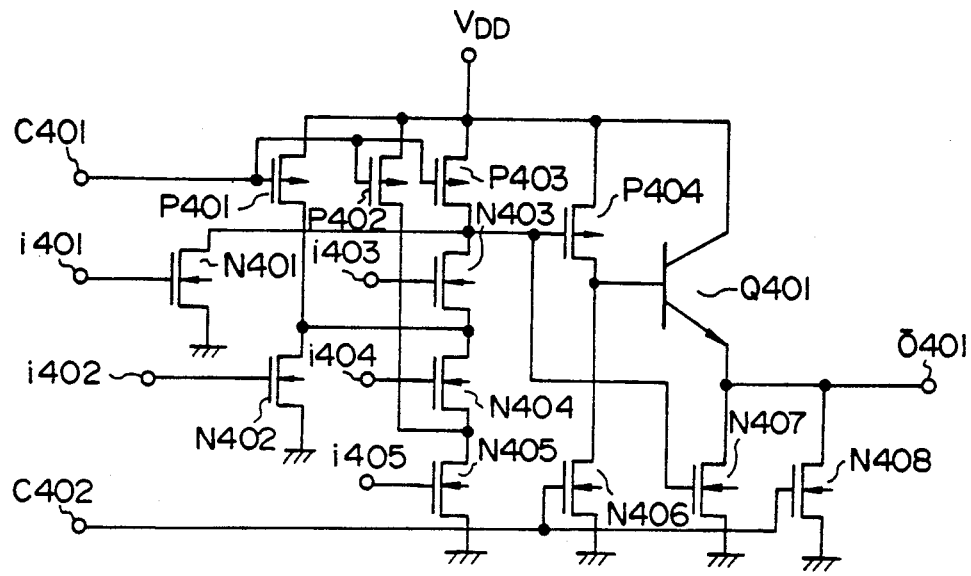
Figure 4B:
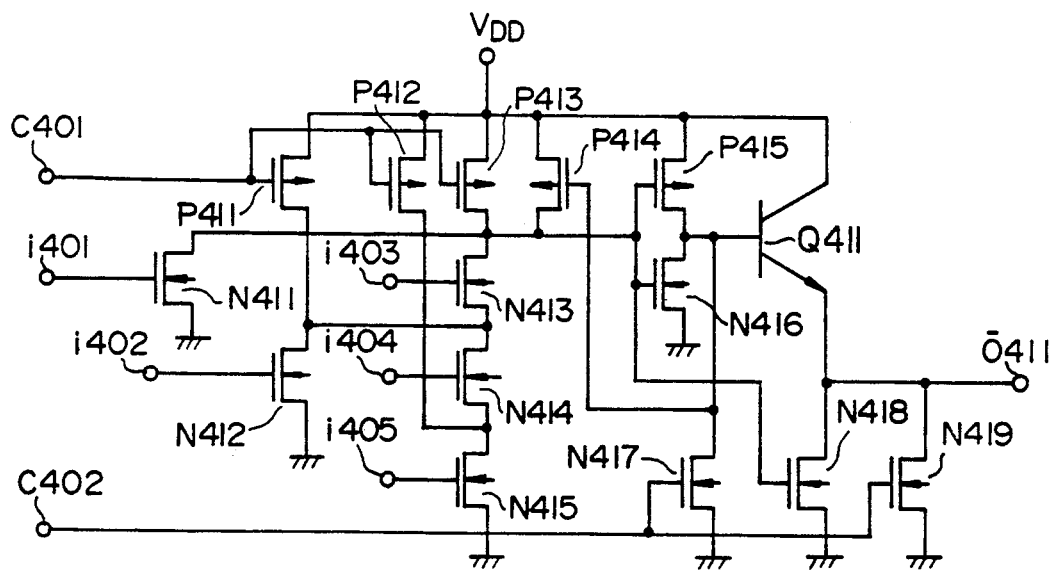

FIGS. 4A and 4B show the other example of the unit cell used in the present invention, and particularly a Bi-CMOS precharge circuit in a different circuit form from that of FIG. 3A. In these FIGS., C401 and C402 are clock signal wirings; i401 to i405 are input signal wirings; 0401 and 0411 are output signal wirings; P401 to P404 and P411 to P414 are PMOSFET's; N401 to N408 and N411 to N419 are NMOSFET's; and Q401 and Q411 are NPN bipolar transistors. Incidentally, the circuit of FIG. 4A corresponds to that of FIG. 3 in U.S. Pat. Application Ser. No. 246,196 identified above, and the circuit of FIG. 4B corresponds to that of FIG. 8A in the U.S. Ser. No. 397,199. The circuits of FIGS. 4A and 4B are different from the circuits disclosed in these U.S. Pat. Applications only in the construction of a logic network for carrying out a predetermined logic operation; the operation of FIGS. 4A and 4B, therefore, is not explained here.

Figure 5:
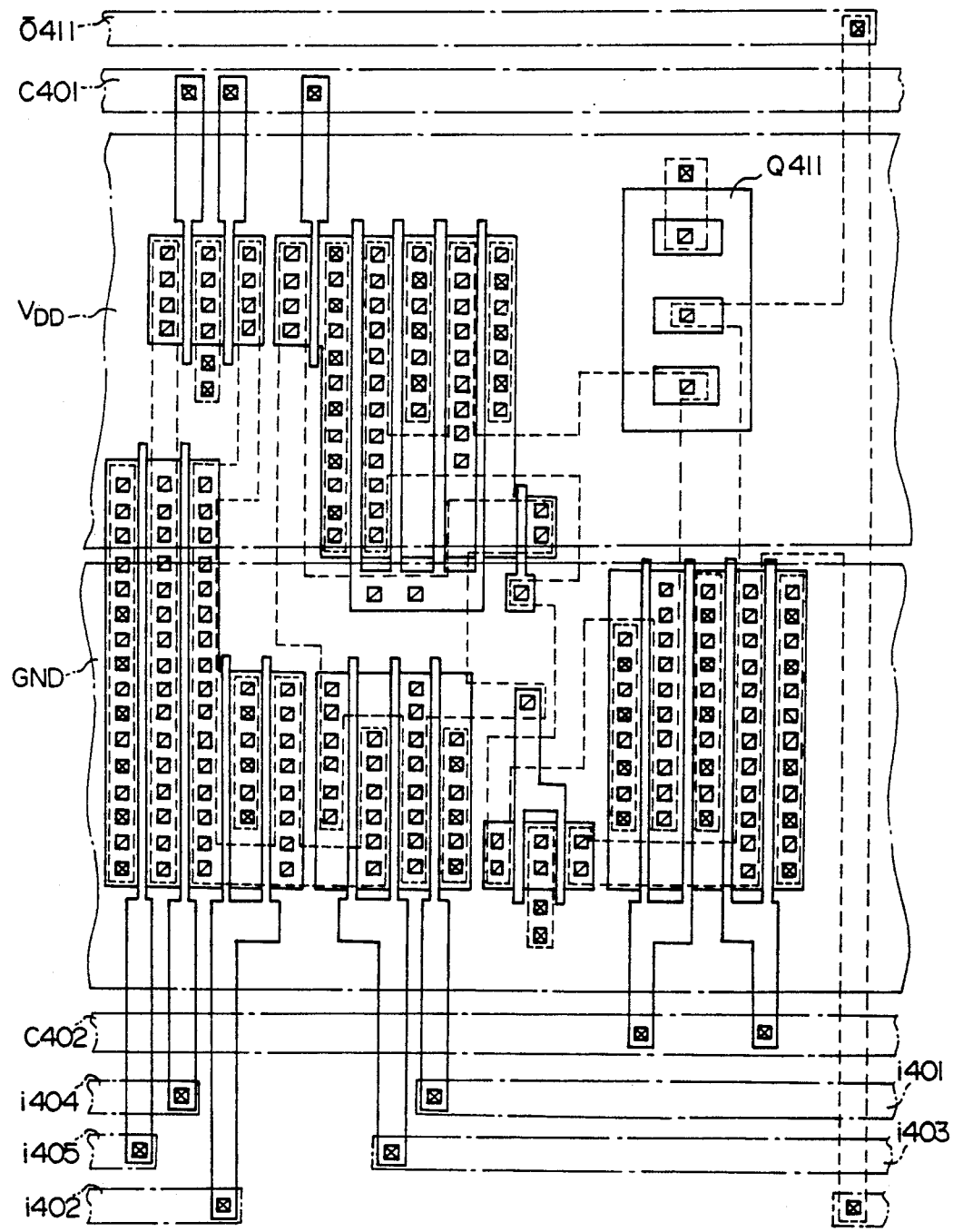
FIG. 5 is a view of cell layout of the circuit of FIG. 4A.

FIG. 5 shows an example of the schematic layout of the circuit of FIG. 4B. It will be understood from the layout of FIG. 5 that in accordance with the present invention, automatic designing using the DA technique can be carried out as in FIG. 1B. Since the circuit of FIG. 4A or 4C requires two clock signal wirings of C401 and C402, the two clock signal wirings are arranged adjacently to the upper and lower sides of cell rows as shown in FIG. 5.

The dynamic cell using a Bi-CMOS circuit provides the following advantages.

1. Since the dynamic cell using a CMOS circuit (FIGS. 1A to 1D) and the dynamic cell a Bi-CMOS circuit (FIG. 3A and FIGS. 4A and 4B) can be handled equivalently from the point of view of automatic designing by means of the DA technique, a designer for a logic LSI can automatically design both of an LSI using CMOS circuits and an LSI using Bi-CMOS circuits. Generally, the Bi-MOS circuits permit a high speed LSI to be realized as compared with the CMOS circuits, but the former requires a higher production cost than the latter because of its complicated fabrication process. Therefore, the automatic designing according to the present invention enables an LSI with required performance, cost, etc. to be designed without changing the logic design thereof.

2. Generally, the automatic designing by the DA technique result in a longer length of the wirings between the cells and larger variation thereof than manual designing. This can increase the load capacitance in the circuit and the variation thereof, and also increase the delay time of the circuit, and variation thereof. The increase of the load capacitance or the delay time leads to the reduction in the circuit performance, and also the increase of their variation, which must be previously considered as margin, means the substantial reduction of the circuit performance. In accordance with the present invention, the presence of the Bi-CMOS circuits, which is smaller in the dependency of the circuit performance on the load capacitance than the CMOS circuits because of its large current driving capability, can relax the reduction of the circuit performance. The Bi-CMOS circuits can be used preferably for the LSI to be automatically designed.

Now, a method of constructing a cell library in accordance with the present invention will be explained. Generally, in order to automatically design an LSI in a standard cell system, a cell library consisting of plural kinds of unit cells having several logic functions is required. Several tens of unit cells are required to construct the cell library and also the layout thereof was manually made individually; therefore the number of required steps was enormous. Moreover, if the layout of the dynamic cells including precharge circuits is carried out by the conventional technique, the number of required steps will be further increased since with respect to the dynamic nodes, attention must be paid to the matters mentioned above. The present invention intends to solve this problem.

Figure 6A:
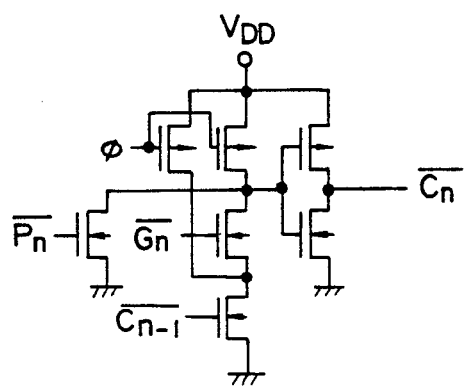
FIGS. 6A to 6C are circuit diagrams of cell units respectively.
Figure 6B:
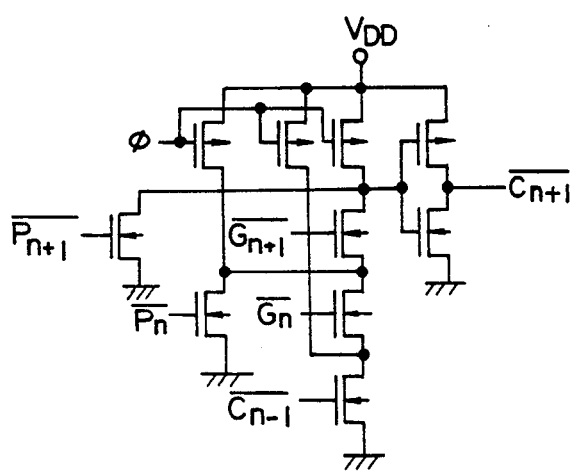
Figure 6C:
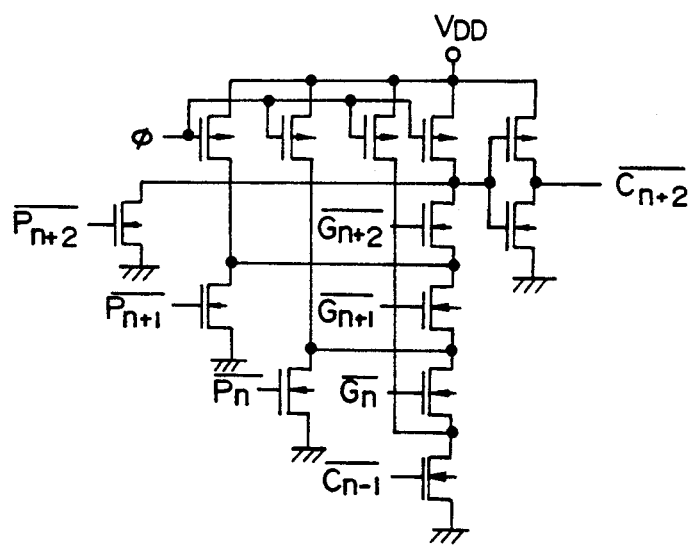

FIGS. 6A, 6B and 6C show examples of the circuit diagrams of unit cells, in particular, dynamic cells including precharged circuits, included in the cell library according to the present invention. These cells are required to construct a carry look ahead generator commonly used for an adder requiring a high speed. Each of these cell is fabricated by composing several kinds of sub-cells (referred to as 'standard cells') having the layout information about the devices (MOSFET's, bipolar transistors, resistor, etc.) in the cell and a power supply wiring, sub-cells inherent to each unit cell (referred to as "wiring cells") having the layout information about in-cell wiring layers, contact holes, through-holes and the arrangement of required standard cells.

Figure 7A:
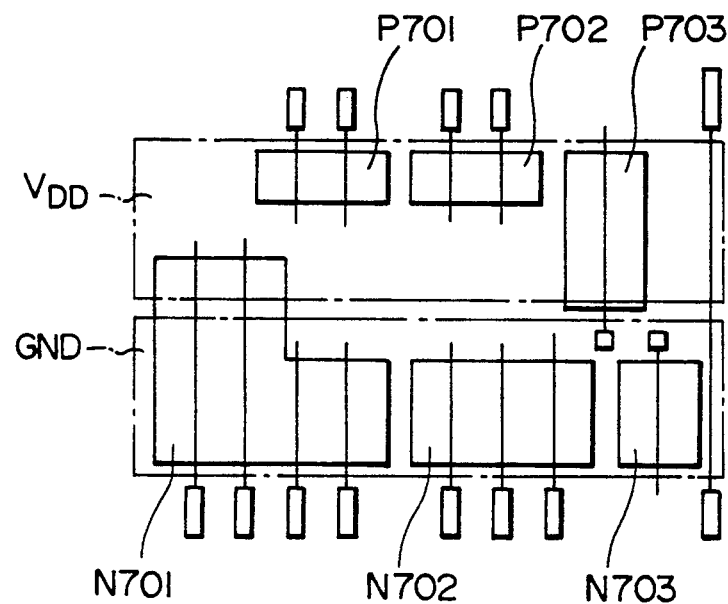
FIGS. 7A and 7B are views showing basic cells used in the present invention.
Figure 7B:
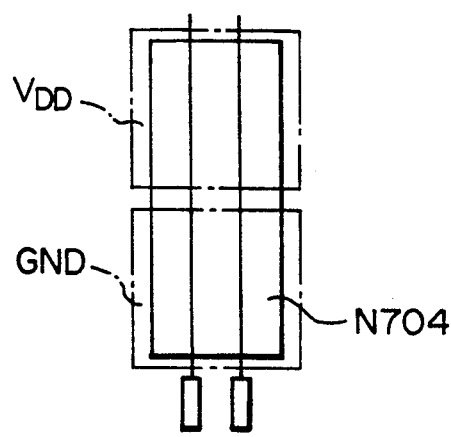

FIGS. 7A and 7B show examples of the standard cell. In FIGS. 7A and 7B, P701 to P703 are PMOSFET areas previously arranged; N701 to N704 are NMOSFET areas; $V_{DD}$ is a power supply wiring; and GND is a ground wiring. It is disclosed in Proceedings of the ISSC, 1982, pp. 112 to 115 to realize the high speed by designing NMOSFET's connected in series in each of the circuits as shown in FIGS. 6A to 6C so that they have larger gate widths in the order accessing to ground. The standard cell A shown in FIG. 7A can be easily realized such a design by including MOSFET areas (e.g. N701) having several gate widths. For example, among NMOSFET's N101 to N104 connected in series in the cell of FIGS. 1A and 1B, the gate width of N103 and N104 is set to be larger than that of N101 and N102.

Figure 8A:
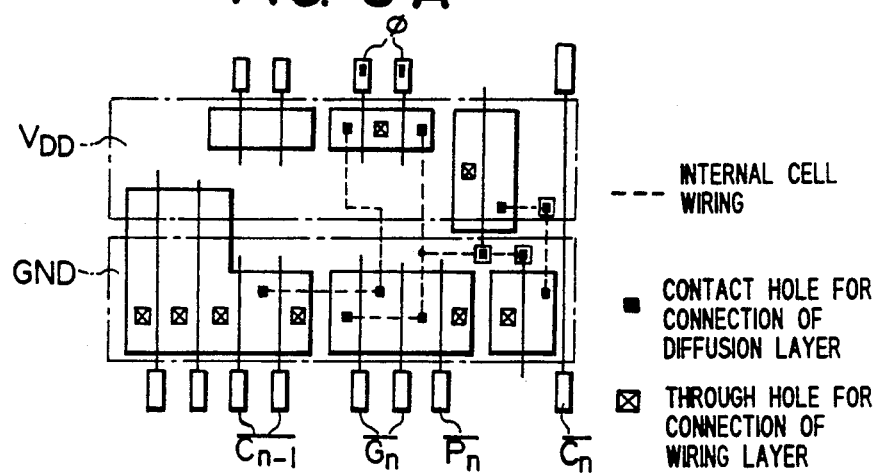
FIGS. 8A to 8C are views showing the cell layout of one example of the unit cell used in the present invention.
Figure 8B:
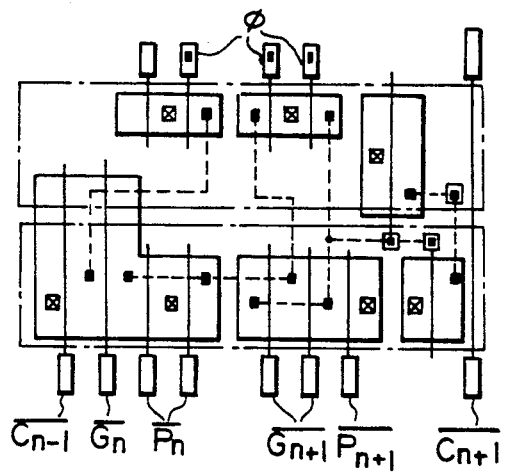
Figure 8C:
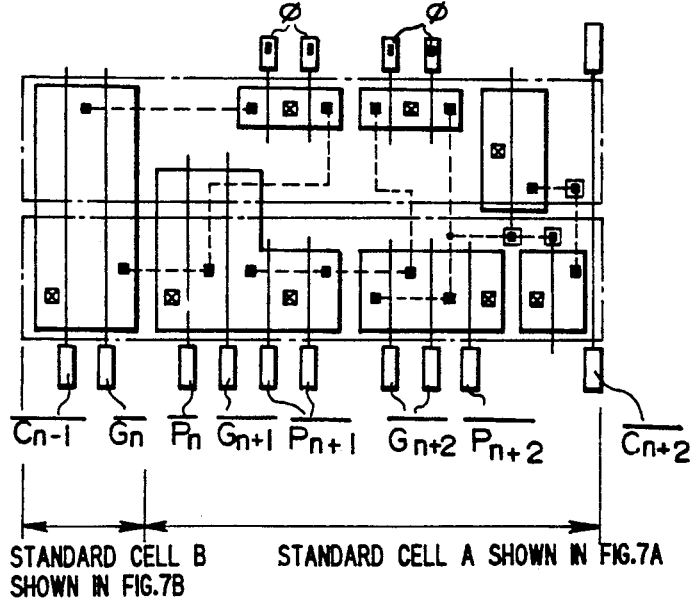

FIGS. 8A to 8C show examples of the unit cells with the layout formed by composing the standard cell of FIG. 7A or 7B and the wiring cell. FIGS. 8A, 8B and 8C correspond to FIGS. 6A, 6B and 6C, respectively. Each of the unit cells shown in FIG. 8A and 8B is formed by composing the standard cell of FIG. 7A and the wiring cell specific to the unit cell. The unit cell of FIG. 8C is formed by composing the standard cells A and B of FIG. 7A and 7B adjacently arranged and the wiring cell. Further, the layout of the standard cell is carried out in the same manner as the conventional cell layout whereas the layout of the wiring cell is carried out in a DA system (the designer has only to symbolically input, the information about contact holes, through-holes and in-cell wirings and is not required to do the work of converting the information into an actual pattern).

The method of forming the unit cells as mentioned above has the following advantages.

a. The work of layout of unit cells can be reduced from several tens kinds of unit cells to only several kinds of standard cells.

b. By previously considering the handling of dynamic nodes in designing the standard cell, the necessity of considering it for each dynamic cell again can be removed as long as the dynamic cell is formed using that standard cell.

c. The layout of the wiring cell can be symbolically made so that the logic change in the unit cell and addition of a new unit cell can be made in a short time.

d. If the layout of the unit cell must be modified owing to the change of a layout rule, it is only necessary to modify the standard cells and change the DA parameters for converting the symbolic data for the wiring cells into a pattern. The amount of work required to modify the unit cells can be greatly reduced (Conventionally, it was necessary to modify all of the unit cells).

Thus, the time required to construct and modify the cell library can be greatly reduced.

Now, explanation will be given for a system for carrying out by means of the DA technique the automatic arrangement and automatic wiring for several kinds of unit cells fabricated by the method described above thereby to complete the design of LSI.

Figure 9:
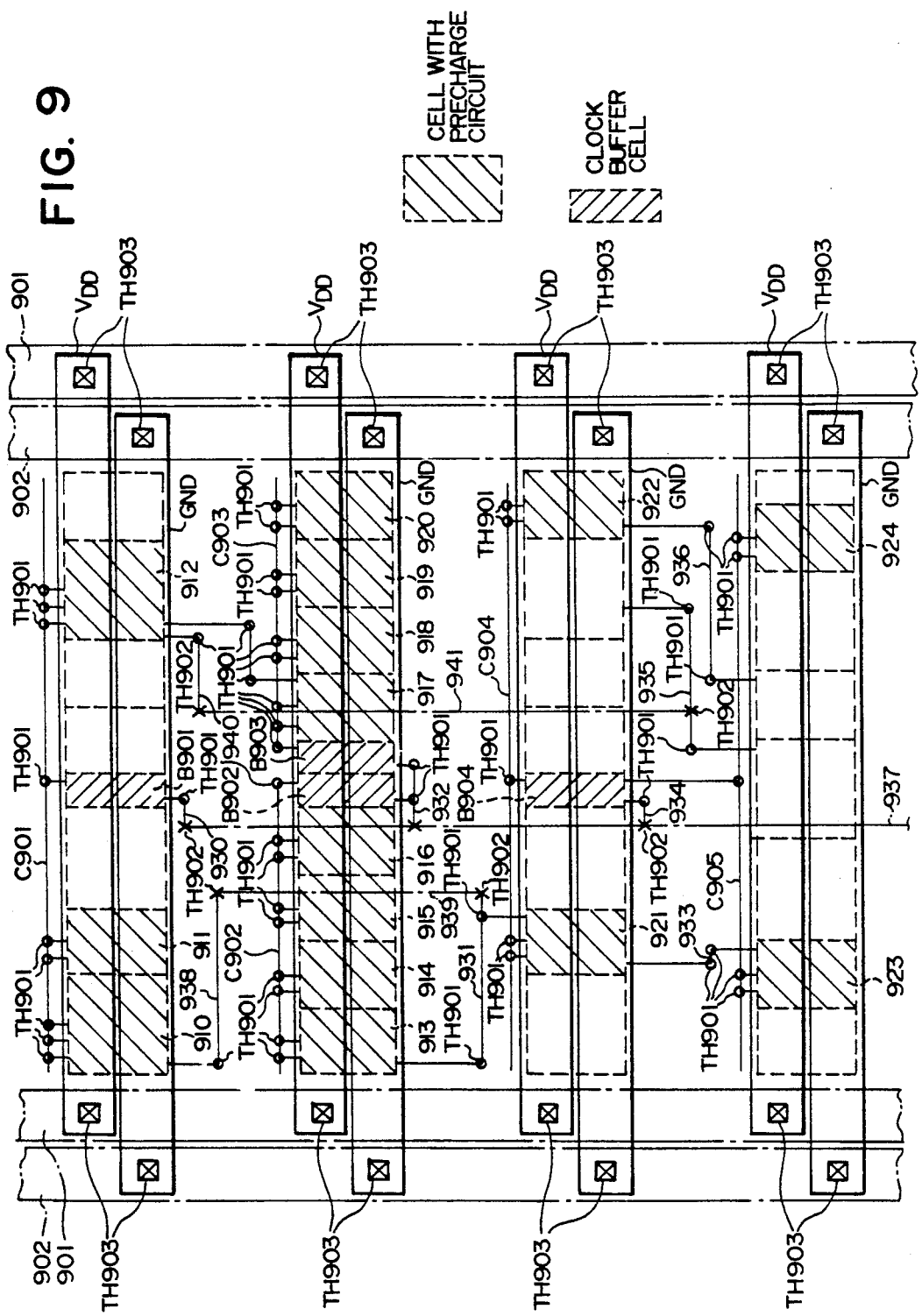
FIG. 9 is a layout diagram of the block of a semiconductor integrated circuit apparatus according to one embodiment of the present invention.

Generally, the design of LSI is advanced hierarchically. Specifically, first, blocks are designed by carrying out the arrangement of unit cells and wiring for individual blocks having a certain logical unit, and these blocks are arranged and the wiring therefor is made. FIG. 9 schematically shows an example of the block formed by arranging unit cells for the block and making the wiring therefor. In FIG. 9, 901 is a power supply stem line; 902 is a ground stem line; 910 to 924 are dynamic cell including precharge circuits; B901 to B904 are clock buffer cells; C901 to C905 are clock signal wirings; TH901 to TH903 are through-holes; 930 to 936 and 939 to 941 are inter-cell wirings; and 937 is a clock stem line. In this example, the inter-cell wirings 939 and 941 and the clock stem line 937 are wiring areas located between the cell rows and above the shielding layer of $V_{DD}$ and GND. Actually, many such wirings are provided so that only 937, 939 and 941 are shown for avoiding the complexity of illustration. Therefore, signal wiring areas are also located above the dynamic cells 910 to 924 each including precharge circuit; the wirings between the cell rows, e.g. between cells a first row and those in a third or fourth row can be optionally provided without being limited to the signal wiring areas. Also, the cell row consisting of cells 913 to 920 can be constituted without any gap so that the length thereof can be shortened.

In order to design an LSI using precharge circuits, it is necessary to supply clocks in phase to all the dynamic cells each including a precharge circuit. To do so, the loads for the clock buffers for supplying clock signals must be made equal to each other thereby to prevent skew from being generated owing to the difference in the resultant delay time. The block of FIG. 9 intends to realize this. In the uppermost cell row, only one clock buffer cell B910 and only on clock signal wiring C901 are provided for three dynamic cells 910, 911 and 912 to be supplied with clocks. In the second stage cell row, two clock buffer cells B902 and B903 and two clock signal wirings C902 and C903 are provided since many dynamic cells (913 to 920) to be supplied with clocks are included in the cell column. Thus, the clocks are separately supplied in the manner of dividing the cell row into two. Further, in the third and fourth stage rows, a clock buffer cell B904 is commonly used for both stages since few dynamic cells (921, 922; 923, 924) to be supplied with clocks are included. The clocks from the clock buffer cell B904 are supplied through clock signal wirings C904 and C905 to the third and fourth stages, respectively. In this way, the number of the clock buffer cells must be changed for the respective stage cell rows so that the load for the clock buffer cell is substantially equal for the dynamic cells belonging to each cell row. The cell library in accordance with the present invention enables this word to be automated for the following reasons.

1. Since the clock buffer cells and the dynamic cells each provided with a precharge circuit are included in the same cell library, they can be handled from the point of view of DA.

2. A channel for the clock signal wiring is provided along the cell row.

FIGS. 20A to 20C show examples of the clock buffer cells B901 to B904 in FIG. 9. The clock buffer cell shown in FIG. 20A is constituted by a CMOS inverter, and that shown in FIG. 20B is constituted by a BiCMOS circuit. In FIGS. 20A and 20B, i2001, i2002 are input terminals; 02001, 02002 are output terminals; P2001, P2002 are PMOSFET's; N2001 to N2004 are NMOSFET's; and Q2001, Q2002 are NPN bipolar transistors. FIG. 20C shows a layout of the circuit of FIG. 20A; the reference symbols designate like parts in FIG. 1B.

Figure 10:
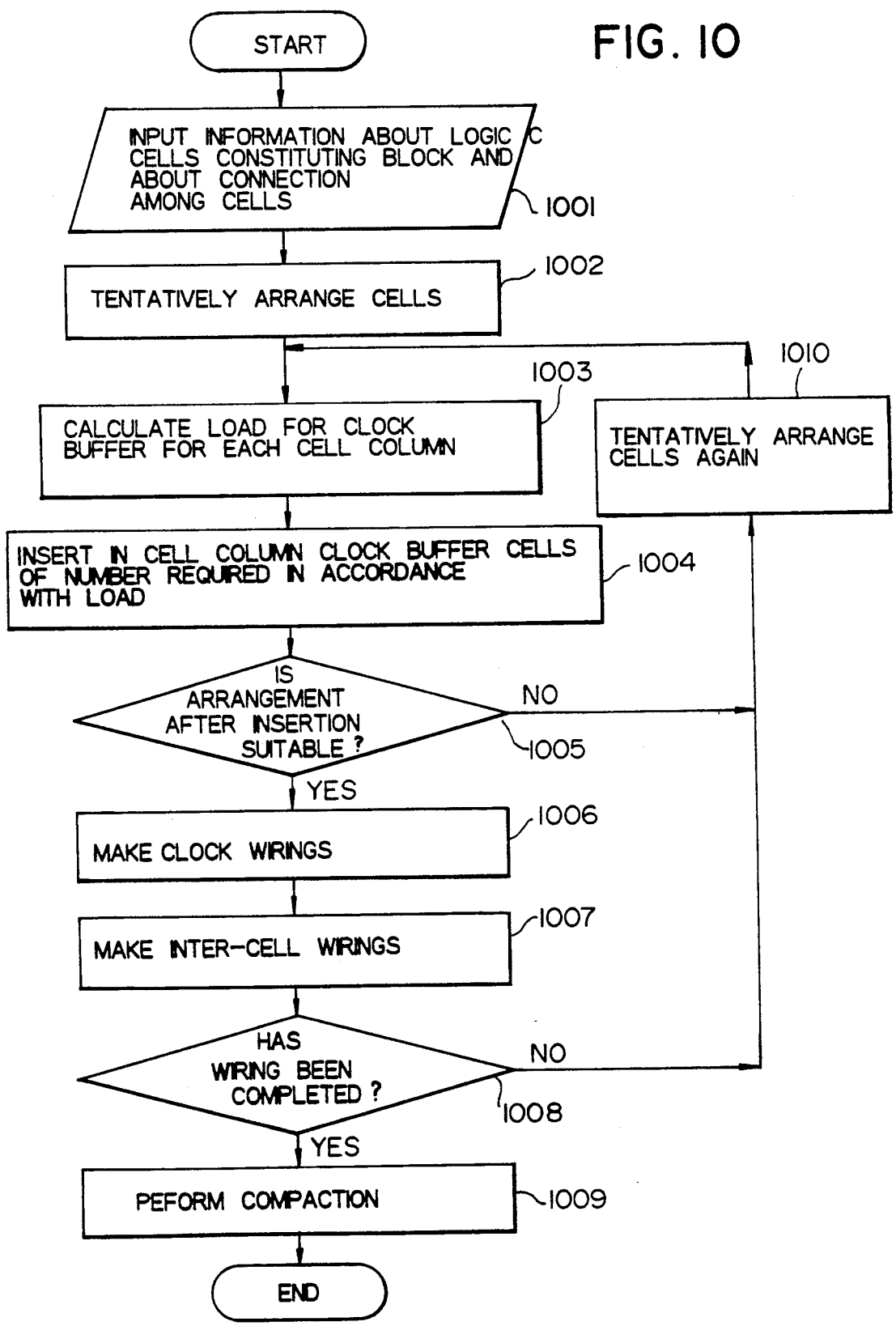
FIG. 10 is a flow chart of the block automatic layout according to one embodiment of the present invention.

FIG. 10 shows an example of the flowchart for executing the automatic arrangement and the automatic wiring of a block.

In Step 1001, a logic designer inputs design data for a block to be designed. Then, it is not necessary to input the design data for the section for supplying clocks to the dynamic cells each with a precharge circuit since it is to be automatically designed.

In Step 1002, the unit cells included in the block are automatically arranged tentatively on the basis of the input design data.

In Step 1003, the load of the clock buffer cell in each cell row due to the tentative arrangement is calculated.

In Step 1004, the clock buffer cells the number of which is enough to make the load of each buffer substantially equal in each cell row are inserted in the respective cell rows. In this step, more clock buffer cells are inserted in the cell row including more unit cells to be supplied with clocks; therefore, the length of cell rows may be greatly different from those of other cells.

Thus, in Step 1005, this is checked.

If the difference exceeds a permissible limit, in Step 1006, the tentative arrangement is changed.

On the other hand, if the above difference is permissible, in Step 1006, the wiring for the section for supplying clocks is made. This step can be easily carried out owing to the provision of channels along the cell columns as mentioned above.

In Step 1007, the automatic wirings are made among the unit cells.

In Step 1008, if or not necessary wiring have been made is checked.

If it is 'no', in Step 1010, the tentative arrangement is changed; thereafter Step 1003 et seq. are carried out again.

If it is 'yes', finally, in Step 1009, compaction processing of compacting the area of the channels is performed.

In this way, the automatic design of the block is completed.

Now, explanation will be given for a method for making the automatic arrangement and the automatic wirings for the block designed in accordance with the above flowchart.

Figure 11:
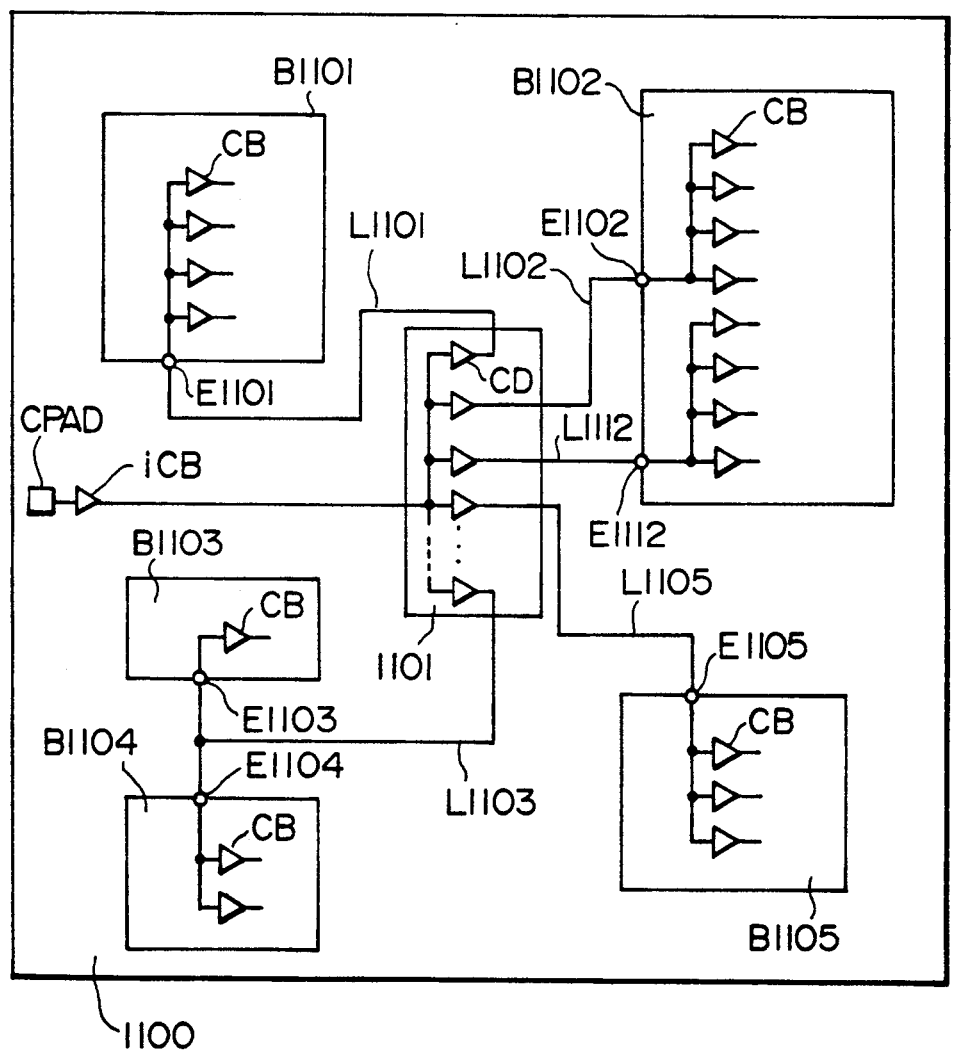
FIG. 11 is a chip layout diagram showing one embodiment of the present invention.

FIG. 11 shows the layout of the LSI chip in which the clock supply section or system is designed in accordance with the present invention. In FIG. 11, 1100 is an LSI chip; B1101 to B1105 are blocks; 1101 is a clock block; CPAD is a clock input pad; iCB is a clock input buffer; CB's are clock buffers; CD is a clock driver; L1101 to L1103 and L1105 are inter-block wirings; and E1101 to E1105 and E1112 are clock input terminals. The clock buffers CB's correspond to the clock buffers B901 to B904 in FIG. 9. Incidentally, the clock supply system is disclosed in ISSC Digest of Technical Papers, 1987, pp. 86.

It is necessary to make the load for the each clock driver CD equal among the respective blocks as in inside each block as described in connection with FIG. 9. In the example of FIG. 11, the clock driver's CD's and inter-block wirings L1101 to L1105 are shared one by one for the blocks B1101 to B1105. Two clock drivers CD's and two inter-block wiring L1102 and L1112 are shared for the block B1102 including many clock buffers. Further, one clock driver CD and one inter-clock wiring are commonly shared for the blocks B1103 and B1104 which include few clock buffers.

Figure 12:
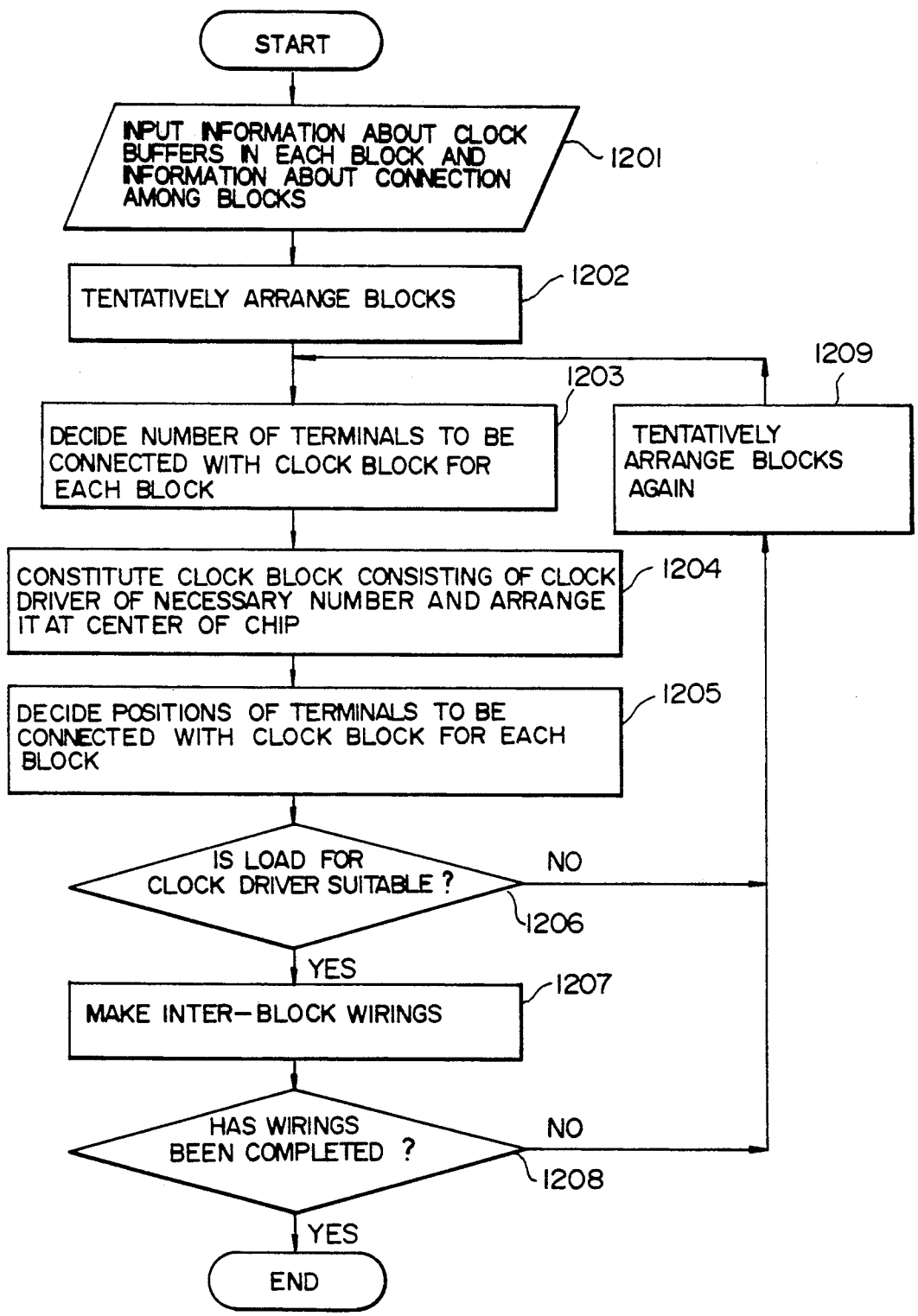
FIG. 12 is a flow chart of chip automatic layout according to one embodiment of the present invention.

FIG. 12 is an example of the flowchart for automatically designing the clock supply system as shown in FIG. 11.

In Step 1201, a logic designer inputs the data about connection between the clock buffers inside each of the blocks and between the blocks. Then, it is not necessary to input the clock supply system for precharge circuits.

In Step 1202, the blocks are automatically arranged tentatively.

In Step 1203, the number of terminal(s) to be connected with the clock block 1101 in FIG. 11 is decided for each block. A method for deciding it will be explained later.

In Step 1204, the clock block 1101 including clock drivers corresponding to the sum of terminals of the respective blocks is constituted and centrally arranged on the chip 1100.

In Step 1205, the position(s) of the terminal(s) to be connected with the clock block is decided for each block, and the clock wirings are made between the blocks.

In Step 1206, if the load of the clock driver is suitable for each block is decided (In Step 1203, an estimated value is used as the load of the clock driver so that the load actually provided by the clock wiring in Step 1205 may be unsuitable).

If it is 'no', in Step 1209, the tentative arrangement of blocks is performed again. The processing of Step 1203 et seq. follows.

On the other hand, if it is 'yes', in Step 1207, the inter-block wirings other than the clock wirings are made.

Finally, in Step 1208, if all the wirings have been completed is decided. If it is 'yes', the automatic design of the LSI is completed. If it is 'no', the processing of the tentative arrangement of the blocks is carried out again.

Figure 13:
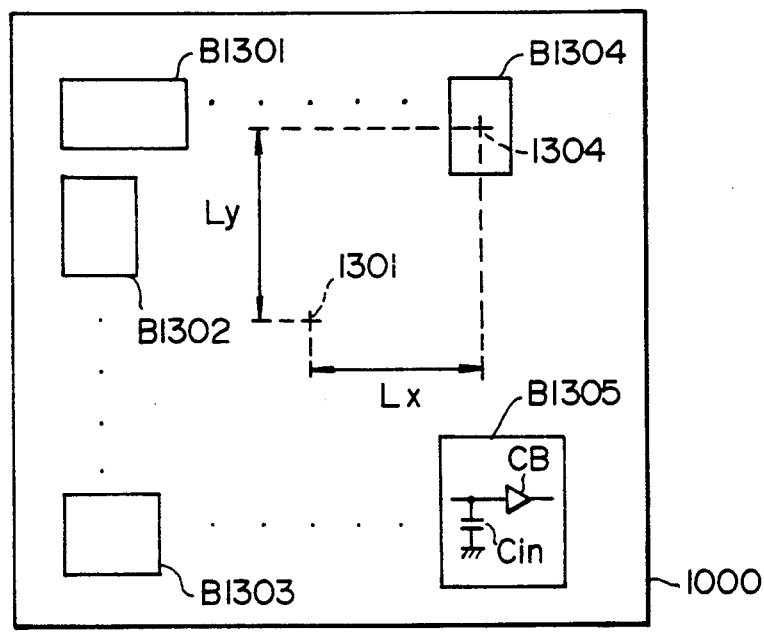
FIG. 13 is a view for explaining the method for estimating the load of a clock buffer.

FIG. 13 is a view for explaining a method of estimating the load of the clock driver in order to perform Step 1203. In FIG. 13, B1301 to B1305 are blocks; 1301 is a central point of the chip; 1304 is a central point of the block 1304; and $C_{in}$ is an input capacitance of the clock buffer CB.

The load for each clock driver CD in the clock block is given by the sum of wiring capacitance and the input capacitance of the clock buffer(s). The former must use an estimated value since it cannot be calculated correctly until the design of an LSI has been completed. Generally, the area occupied by the clock block or each the other clock is sufficiently smaller than that of the entire chip, and also the wiring inside the chip is made using channels on lattice dots. The wiring distance can be approximated to Manhattan distance $L_x$ and $L_y$ between the central point 1301 and the central point of the block in issue. Therefore, assuming that the number of clock buffers in the block is n, and the average wiring capacitance per unit length is $C_1$, the estimated value $C_{LOAD}$ of the load for each clock driver can be expressed by $$C_{LOAD} = C_1 \times (L_x + L_y) + n \times C_{in}$$

Figure 14:
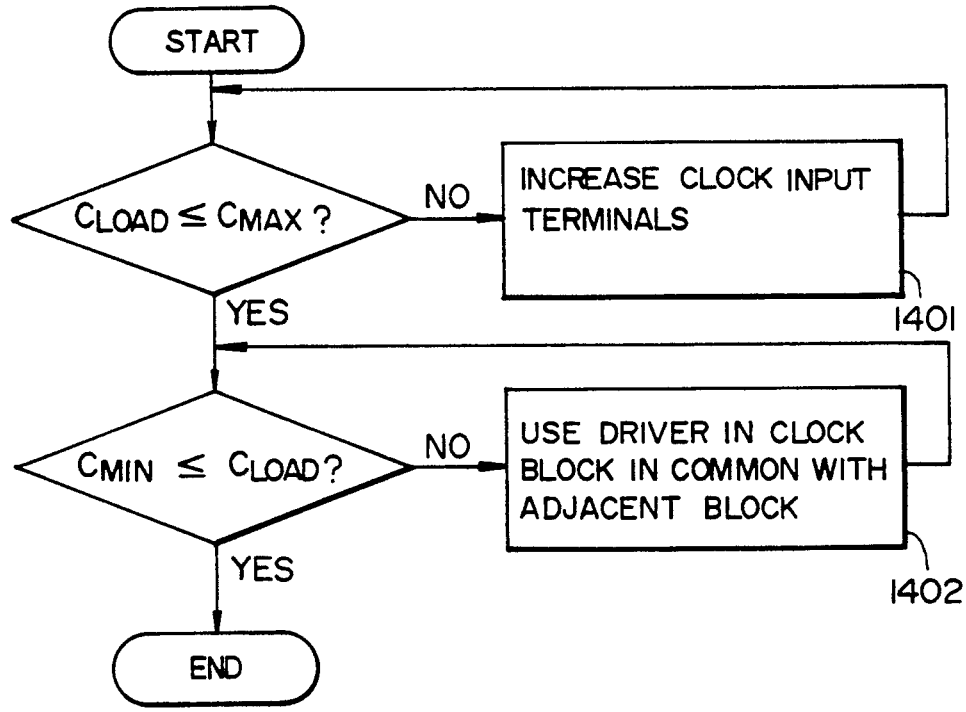
FIG. 14 is a flow chart showing one example of the method for deciding the number of clock buffers.

FIG. 14 shows an example of the flowchart of the method for deciding the number of terminal(s) of each block using the estimated value $C_{LOAD}$ of the load provided by the above method. Now it is assumed that the upper limit of $C_{LOAD}$ for satisfying the specification on the clock skew between the blocks is $C_{MAX}$ and the lower limit is $C_{MIN}$. To realize this, in accordance with FIG. 14, first, if $C_{LOAD}$ is not larger than $C_{MAX}$ is decided for each block. If this condition is not satisfied, in Step 1401, $C_{LOAD}$ is decreased by increasing the number of clock input terminals (this corresponds to the example of the block B1102 in FIG. 11). If the condition for $C_{MAX}$ is satisfied, decision is made on if $C_{LOAD}$ is not smaller than $C_{MIN}$. If this is not satisfied, in Step 1402, $C_{LOAD}$ is increased by commonly using a clock driver together with an adjacent block (this corresponds to the example of the blocks B1103 and B1104 in FIG. 11. Larger values in both blocks may be used as $L_x$ and $L_y$). If $C_{MIN} < C_{LOAD} < C_{MAX}$ is satisfied for all the blocks, Step 1203 is completed in FIG. 12. In this way, the clock supply system inside each block and between the blocks can be automatically designed without being indicated by a logic designer.

Figure 16:
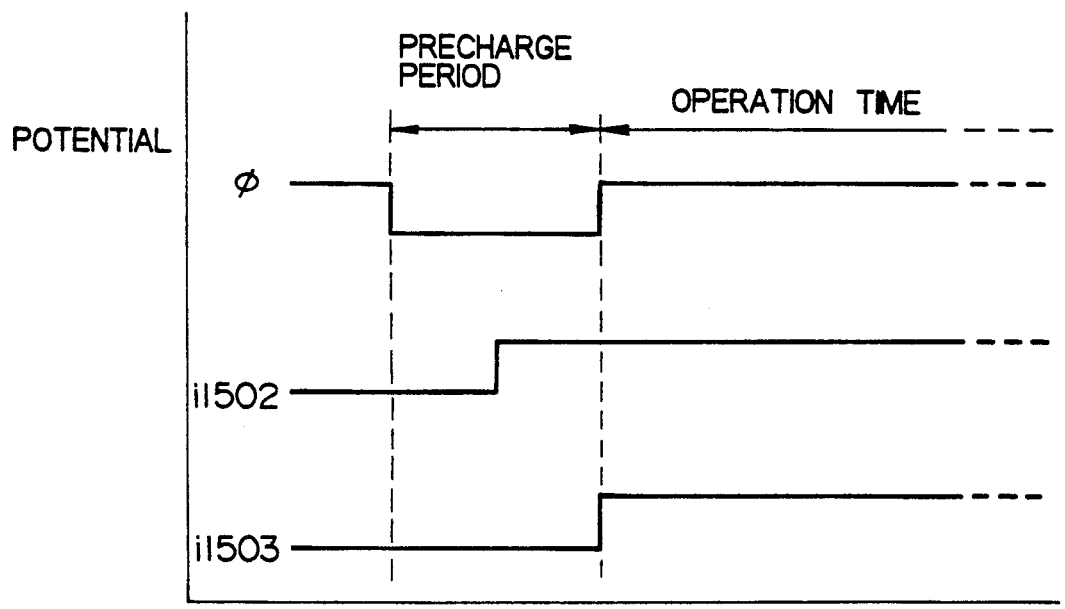
FIG. 16 is a waveform chart of the input signal in FIG. 15.

FIGS. 15A and 15B show an example of connecting, in series, plural stages of dynamic cells each provided with a precharge circuit. FIG. 16 shows an example of input signals for the circuit of FIG. 15. In FIGS. 15A and 15B, 1501 to 1506 are dynamic cells each provided with a precharge circuit;—'s are clock signal wirings; i1501 to 1503 are input signal wirings; O1501 is an output signal wiring of the cell 1501; AND is an AND circuit; and N1501 and N1502 are NMOSFET's.

As proposed in JPA-62-98827, there are two kinds of precharge circuits; the one is a precharge circuit in which the source of MOSFET (NMOSFET N1501 in the cell 1501 in FIG. 15) to which a signal is supplied is connected to ground, and the other is a precharge circuit in which MOSFET (NMOSFET N1504 in the cell 1504 in FIG. 15) to which a clock signal—is supplied is inserted. The former (FIG. 15A) operates at a higher speed than the latter, but MOSFET N1501 with its source connected to ground is required to be 'off' during the precharge operation. Therefore, in the case where the input signal i1502 becomes 'high' as seen from FIG. 16 during the precharge operation, the input signal i1503 is required to be forcibly made 'low' during the period. As a result, inputting the input i1502 will increase the number of circuit stages and so the delay time of the entire circuit. On the other hand, in FIG. 15B, the provision of NMOSFET N1504 makes it unnecessary to provide the AND circuit. Although the cell 1504 operates at a lower speed than the cell 1505, because of absence of the AND circuit, the arrangement of FIG. 15B can shorten the delay time as compared with that of FIG. 15A in the comparison in their entire circuit.

It is troublesome for a logic designer to direct DA to properly use such two kinds of circuits for all paths, and so some mistake may occur. In contrast, in accordance with the present invention, the above problem can be obviated for the reasons: (1) two kinds of unit cells having the same logic function (the combination of the cells 1501 and 1504 described above) are included in a cell library, and (2) a logic designer has only to input the required logic function (which kind of unit cell is to be imparted to the input logic function is decided by DA).

Figure 17:
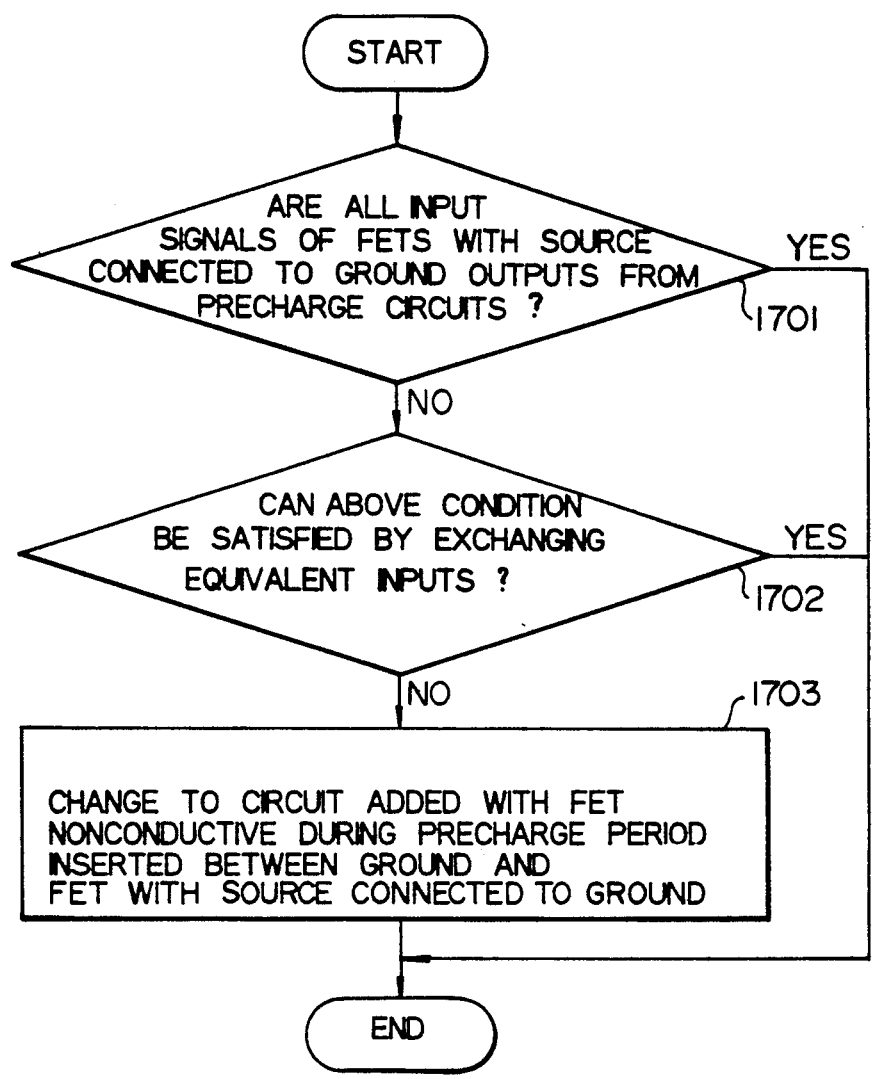
FIG. 17 is a flow chart of one example of the method for deciding an optimum combination of unit cells.

FIG. 17 is a flowchart for selecting the unit cell. It is assumed that the unit cells to be selected include a precharge circuit with the source of MOSFET to be supplied with a signal being connected to ground (cell 1501). In Step 1701, decided is whether or not all the input signals to the MOSFET's with the source connected to ground are output signals from the precharge circuits. If some input signals do not satisfy this condition, in Step 1702, decided is whether or not the above condition can be satisfied by exchanging inputs providing the equivalent logic function even if they are exchanged (e.g. inputs of an AND circuit or OR circuit). If the above condition cannot be still satisfied, in Step 1703, the input cell in issue is first exchanged by a unit cell of the type of the unit cell 1504. In this way, by mainly using the unit cells of the type of the cell 1501 and using the unit cells of the type of the cell 1504 only at required positions, a high speed logic circuit can be realized.

Figure 18:
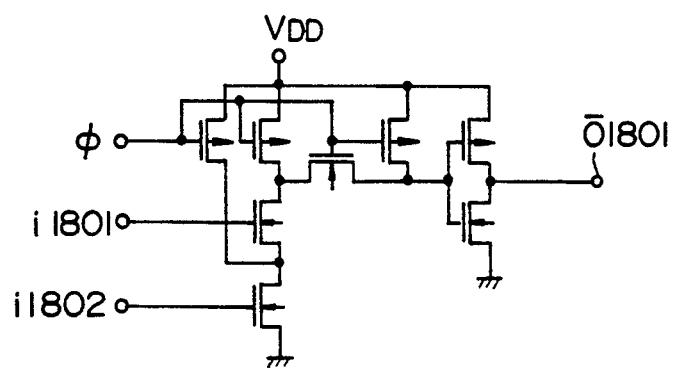
FIG. 18 is a circuit diagram of the unit cell of a precharged circuit in the other circuit form.

FIG. 18 shows the unit cell with a precharge circuit different from the two kinds of unit cells described above. In FIG. 18, i1801 and i1802 are input signal terminals, and O1801 is an output signal terminal. The same effect can be provided also by using this unit cell instead of the cell unit 1501.

FIG. 19 shows a schematic arrangement of the LSI chip in accordance with the present invention. In FIG. 19, 1900 is an LSI chip; 1901 is a clock block; and B1901 to B1907 are blocks. The hatched blocks include dynamic cells each with a precharge circuit whereas the remaining blocks include static circuits and RAM's. Generally, in designing a high speed LSI, first, the blocks each consisting of an arithmetic unit, a RAM unit and a random logic unit are designed and arranged, and thereafter, wirings for signals, clocks and power supply among the blocks, thus completing the design of the LSI. By carrying out the design and layout of the blocks including the dynamic cells each with a precharge circuit, and the clock signal wirings for the blocks in accordance with the present invention, it is possible to shorten the design time of the high speed LSI.

As described above, in accordance with the present invention, it is possible to construct and modify, in a short period, a cell library consisting of unit cells each provided with a charge circuit, and also automatically design a high speed LSI using this cell library thereby to greatly reduce the number of required design steps.

Although the present invention has been explained in connection with several kinds of unit cells each provided with a precharge circuit formed of a CMOS circuit or Bi-CMOS circuit, it can be applied to a semiconductor integrated circuit in a standard system comprising dynamic unit cells in the other circuit form.

The present invention constructed as explained above has the following advantages.

a. Although the dynamic cells including nodes in a dynamic operation are provided, signal wiring areas can be located above the dynamic cells by covering the dynamic cells with a power wiring layer and a ground wiring layer. Thus, the signal wiring areas are not limited so that automatic layout wiring can be made.

b. A cell library in which the specification about the layout (shape, positions of terminals, etc.) of dynamic cells is the same as the cells in the other circuit form is constructed; this cell library includes clock buffer cells and clock signal wirings along cell columns. Thus, blocks in which dynamic unit cells each provided with a precharge circuit and unit cells in the other circuit form are mixedly located can be automatically designed.

c. Since the above blocks are located in an LSI chip area and a clock block is centrally located on the chip area in order to automate the design of the clock block and the connection therebetween, the period required to design the LSI can be shortened.

d. Since the unit cells are composed of standard cells and wiring cells, the required to newly constructed the cell library, add unit cells to the cell library, modify it, etc. can be shortened.

e. Since an optimum set of circuits can be automatically selected for a signal path consisting of precharge circuits connected in series, a high speed LSI can be realized.

We claim:

1. A semiconductor integrated circuit device comprising:
    a plurality of cell rows each including a plurality of unit cells which are formed by electrically connecting circuit components, each cell row comprising a least one kind of unit cell including a clock-controlled dynamic circuit which has a high-impedance node which is precharged under the control of an applied clock pulse to be in a floating state in operation of the cell unit;

at least one shield layer, having a fixed potential, provided over said cell rows so as to cover the high-impedance nodes of the dynamic circuits of said unit cells, and a wiring area including at least a first signal wiring for electrically connecting desired ones of said unit cells, wherein said first signal wiring carries a signal having changes in potential level, said wiring area being located transversely above said shield layer so that said first signal wiring in said wiring area can extend over said nodes of said dynamic circuits without effecting the floating state of the dynamic circuit node.

2. A semiconductor integrated circuit device according to claim 1, wherein said at least one kind of unit cell including a dynamic circuit comprises a standard cell in which circuit components are previously arranged in accordance with a predetermined layout and which includes an in-cell wiring layer for electrically connecting the circuit components of the standard cell.

3. A semiconductor integrated circuit device according to claim 1, wherein said shield layer is located along each cell row so as to cover the cell row, and serves as a power supply wiring layer for supplying power to the unit cells in each cell row.

4. A semiconductor integrated circuit device according to claim 3, wherein said power supply wiring layer comprises a first wiring fixed at a predetermined potential other than ground and a ground wiring, wherein said first wiring and said ground wiring are arranged in parallel.

5. A semiconductor integrated circuit device according to claim 1, wherein each unit cell comprises at least one MOSFET and at least one bipolar transistor.

6. A semiconductor integrated circuit device according to claim 1, comprising at least four layers for wiring arranged on said semiconductor substrate, the first and second layers from the bottom of said four layers being used as wiring layers for connecting the circuit components in the unit cells, the third layer being used as said shield layer, and the fourth layer being used as a wiring layer for connecting the unit cells.

7. A semiconductor integrated circuit device according to claim 6, wherein each unit cell comprises at least one MOSFET transistor, wherein gates of MOSFET's in each unit cell are connected using said first wiring layer.

8. A semiconductor integrated circuit device according to claim 1, wherein one of said plural kinds of unit cells is formed of a static circuit.

9. A semiconductor integrated circuit device according to claim 1, further comprising a clock signal wiring formed between said cell rows, said clock signal wiring being connected with clock input terminals in unit cells formed of said dynamic circuits.

10. A semiconductor integrated circuit device according to claim 9, wherein said clock signal wiring has a width larger than that first signal wirings in said wirings area.

11. A semiconductor integrated circuit device according to claim 9, wherein said clock signal wiring is located at a position nearer to each of said cell rows than other wirings located between said cell rows.

12. A semiconductor integrated circuit device according to claim 1, wherein said plural kinds of unit cells comprise plural unit cells having the same logic capability as one anther but different in at least one characteristic of propagation delay, circuit form and constituent components.

13. A semiconductor integrated circuit device according to claim 1, wherein said plural kinds of unit cells comprise unit cells including bipolar transistors and unit cells not including bipolar transistors.

14. A semiconductor integrated circuit device according to claim 2, further comprising contact-holes located at a first group of predetermined positions in accordance with a predetermined lattice pattern for electrically connecting the in-cell wiring layer with said circuit components, and through-holes located at a second group of predetermined positions in accordance with said predetermined lattice pattern for electrically connecting the in-cell wiring layer with a power supply wiring layer, wherein an in-cell wiring on said in-cell wiring layer for electrically connecting said circuit components is located in accordance with said predetermined lattice pattern.

15. A semiconductor integrated circuit device according to claim 2, wherein said standard cell includes either or both of an MOSFET area and bipolar transistor area.

16. A semiconductor integrated circuit device according to claim 2, wherein said standard cell includes a first group of MOSFETs of a first conductivity type and a second group of MOSFETs of an opposite conductivity type, wherein at least the first group of MOSFETs has a first subgroup of MOSFETs having a first gate width and a second subgroup of MOSFETs having a second gate width different than the first gate width.

17. A semiconductor integrated circuit device according to claim 1, wherein said unit cell provided with a dynamic circuit comprises a standard cell in which circuit components are previously arranged in accordance with a predetermined layout and an in-cell wiring layer for electrically connecting the circuit components.

18. A semiconductor integrated circuit device according to claim 1, wherein said unit cells include at least one kind of clock buffer cell for producing clock signals to be supplied to the unit cells which are provided with a dynamic circuit.

19. A semiconductor integrated circuit device according to claim 1, wherein unit cells provided with a dynamic circuit include clock input terminals which are divided into plural groups, said device further comprising clock signal wirings connected with all said clock input terminals belonging to one of said plural groups wherein said clock signal wirings all have substantially the same load capacitance, and clock buffer cells for supplying clock signals to said clock signal wirings for each group.

20. A semiconductor integrated circuit device according to claim 19, wherein said clock buffer cells are provided one by one for each group in said cell rows.

21. A semiconductor integrated circuit device in a standard cell system including a plurality of unit cells which are formed by electrically connecting circuit components, comprising:

at least one kind of unit cell including a clock-controlled dynamic circuit which has a high-impedance node which is precharged under the control of an applied clock pulse to be in a floating state in operation of the cell unit, said unit cell being included in the plurality of unit cells, at least one wiring layer for connecting said circuit components in each of the unit cells arranged on the substrate, at least one shield layer, having a fixed potential, provided so as to cover at least the high-impedance node of the dynamic circuit, and at least one signal wiring layer located transversely above the shield layer to extend over the node of the dynamic circuit, wherein said signal wiring layer includes at least a first signal wiring for electrically connecting desired ones of the unit cells wherein the first signal wiring carries a signal having changes in potential level and wherein said shield layer is located between the node of the dynamic circuit and the first signal wiring to prevent changes in the potential level on the first signal wiring from adversely affecting the floating state of the dynamic circuit node.

22. A semiconductor integrated circuit device according to claim 21, wherein said shield layer is comprised of a power supply wiring and a ground wiring.

23. A semiconductor integrated circuit device according to claim 22, comprising at least four layers for wiring arranged on said semiconductor substrate, the first and second layers from bottom of said four layers of wiring being used as wiring layers for connecting the circuit components in the unit cells, the third layer being used as said shield layer, and the fourth layer being used as a wiring layer for connecting the unit cells.

24. A semiconductor integrated circuit device according to claim 23, wherein each unit cell comprises at least one MOSFET transistor, and wherein said first wiring layer is used to form a gate electrode of the at least one MOSFET in each of said unit cells.

25. A circuit device according to claim 1, wherein said wiring area is located transversely to at least one of said cell rows.

26. A circuit device according to claim 1, wherein said wiring area is located vertically transversely to at least one if said cell rows.

27. A semiconductor integrated circuit device comprising:

a plurality of cell rows each including a plurality of unit cells previously fabricated on a semiconductor substrate selected from plural kinds of unit cells which are formed by electrically connecting circuit components;

a clock signal wiring for supplying a clock signal to said cell rows;

at least one shield layer having a fixed potential and provided over predetermined portions of said cell rows; and a wiring area including at least a first signal wiring for electrically connecting predetermined ones of said unit cells, wherein each of said cell rows comprises at least one kind of unit cell including a clock-controlled dynamic circuit which has a high-impedance node in a floating state to be precharged in response to the supplied clock signal in operation of the unit cell, and wherein said at least one shield layer having the fixed potential is provide dover the predetermined portions of said cells rows so as to cover the high-impedance nodes of the dynamic circuits of said predetermined ones of said unit cells, and said first signal wiring carries a signal having changes in potential level, said wiring area being located transversely above said shield layer for the electrical connection of the predetermined unit cells, so that said first signal wiring in said wiring area can extend over said nodes of said dynamic circuits of the predetermined unit cells without changes in the potential level on the first signal wiring adversely affecting the floating state of the dynamic circuit nodes, whereby said wiring area and said first signal wiring can be freely located without being restricted by location of said high-impedance nodes of said dynamic circuits.

* * * * *